(12) United States Patent
Dubowski et al.

(10) Patent No.: US 9,111,848 B1
(45) Date of Patent: Aug. 18, 2015

(54) CASCADED TEST CHAIN FOR STUCK-AT FAULT VERIFICATION

(71) Applicant: QUALCOMM Incorporated, San Diego, CA (US)

(72) Inventors: Kenneth Dubowski, San Diego, CA (US); Thomas Clark Bryan, San Diego, CA (US); Mark Wayland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/272,324

(22) Filed: May 7, 2014

(51) Int. Cl.
| | |
|---|---|
| *H01L 23/58* | (2006.01) |
| *H01L 21/66* | (2006.01) |
| *H01L 27/118* | (2006.01) |
| *G01R 31/28* | (2006.01) |
| *G01R 31/3185* | (2006.01) |

(52) U.S. Cl.
CPC .......... *H01L 22/20* (2013.01); *H01L 27/11807* (2013.01); *G01R 31/2884* (2013.01); *G01R 31/318541* (2013.01); *G01R 31/318547* (2013.01); *G01R 31/318555* (2013.01)

(58) Field of Classification Search
CPC .............. H01L 22/20; H01L 27/11807; G01R 31/2884; G01R 31/318541; G01R 31/318547; G01R 31/318555

USPC ........................................... 257/48, 202, 203
See application file for complete search history.

(56) References Cited

U.S. PATENT DOCUMENTS

| | | | | |
|---|---|---|---|---|
| 6,649,931 | B2 * | 11/2003 | Honma et al. | ................... 257/48 |
| 6,925,408 | B2 | 8/2005 | Premy et al. | |
| 7,472,321 | B2 | 12/2008 | Chun | |
| 7,877,651 | B2 | 1/2011 | Whetsel | |
| 8,095,839 | B2 | 1/2012 | Whetsel | |
| 2009/0039897 | A1 | 2/2009 | Fong | |

\* cited by examiner

*Primary Examiner* — Tu-Tu Ho
(74) *Attorney, Agent, or Firm* — Procopio, Cory, Hargreaves & Savitch LLP

(57) ABSTRACT

A control circuit generates data signals and configuration commands that are provided to an interface circuit. The interface circuit includes a configuration circuit that generates configuration signals according to the configuration commands and a drive component that generates interface signals according to the data signals. The interface signals are generated with a drive characteristic determined according to the configuration signals applied to configuration devices that selectively activate a configuration of drive devices. A diagnostic circuit is coupled to the control circuit and the interface circuit and is configured to receive a test state indication and acquire a corresponding portion of the configuration signals. The diagnostic circuit compares the test state indication and the portion of the configuration signals to diagnose a stuck-at fault condition within a faulty configuration circuit and propagate a fault indication to the control circuit.

20 Claims, 7 Drawing Sheets

CASCADED TEST CHAIN FOR STUCK-AT FAULT VERIFICATION

BACKGROUND

1. Field

Aspects of the present invention generally relate to integrated circuits and, more particularly, to the testing of integrated circuit interfaces.

2. Background

The semiconductor industry continually improves the scaling of device feature sizes in successive generations of integrated circuits. Improved scaling results in smaller devices and higher device densities, which produce a higher incidence of circuits composed of these devices to be compromised by faults. Accordingly, there is an increased emphasis on diagnosing circuit faults during manufacture to fully realize the benefits of scaling improvements. To help address the increased demand for determining faults, enhancements have been made to circuit diagnostic capabilities, such as automatic test pattern generation (ATPG), test path sensitization, and controllability of the device being tested. Typically, these testing capabilities include storage devices arranged in scan chains having accompanying control logic and clocking schemes. Scan-based testing provides stimulus and retrieves resulting indications of die functionality based on a fault model at the device-level, gate-level, or interconnect layer. Depending on the fault model implemented; faults, such as opens, shorts, fabrication defects, and stuck-at faults may be controllable and observable by scan-chain-based diagnosis.

Diagnostic improvements have generally been applied to core logic while input/output (I/O) blocks have lagged behind in the application of diagnostic developments. I/O blocks have particular situations and constraints that increase challenges to diagnosis. For instance, requirements on circuits in I/O blocks to produce consistent performance levels across generations of scaled semiconductor fabrication can mean the amount of die area dedicated to performance can correspondingly reduce the area available to implement diagnostic circuits.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to one aspect, a device includes a control circuit which may be configured to generate data signals and configuration commands. The device also includes an interface circuit connected to the control circuit to receive the data signals and the configuration commands. The interface circuit includes at least one configuration circuit that is selectively configured to generate a set of configuration signals according to the configuration commands. A drive component is included in the interface circuit and includes at least one drive device which may be configured according to the data signals to generate interface signals on an output terminal of the interface circuit. The interface signals are generated with a drive characteristic determined according to the configuration signals being applied to configuration devices associated with the drive device. The device also includes a diagnostic circuit coupled to the control circuit and the interface circuit. The diagnostic circuit is configured to receive a test state indication from the control circuit and acquire a corresponding portion of the configuration signals. The diagnostic circuit compares the test state indication and a portion of the configuration signals to determine a stuck-at fault condition within any configuration circuit within the interface circuit.

A further aspect relates to a method for diagnosing faults within an interface circuit. The method includes receiving an indicator of a test state indication being applied from the control circuit to a corresponding test input terminal of the interface circuit. The method also includes receiving configuration commands with a configuration circuit within the interface circuit. The method continues with the configuration circuit generating at least one configuration signal according to a first configuration command. A further step of the method is comparing the configuration signal and the test state indication with at least one stage of a diagnostic circuit. The method continues with generating an indication of a fault existing within the configuration circuit when a difference is determined between the configuration signal and the test state indication. The method concludes with propagating the fault indication to the control circuit through the at least one stage of the diagnostic circuit.

Another aspect relates to an apparatus for diagnosing a fault in an interface circuit. The apparatus includes a control means configured to be coupled to a testing means to receive test commands. The control means is configured to generate data signals and configuration commands according to the test commands. The apparatus also includes an interface circuit coupled to the control means to receive the data signals and the configuration commands. The interface circuit is configured to generate a set of configuration signals according to the configuration commands and generate interface signals according to the data signals. The apparatus also includes a diagnostic means, where at least one stage of the diagnostic means is coupled to the control means and a corresponding interface circuit. The diagnostic means is configured to receive a test state indication and acquire a corresponding portion of the configuration signals.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Traditional circuit diagnostic capabilities have not always been able to focus on I/O blocks with the same capabilities accomplished for addressing faults in core logic. For example, the I/O blocks of mixed-signal system-on-chip (SoC) designs may contain significant quantities of logic gates that are not included in ATPG routines, and therefore have low fault coverage. These logic gates typically control the fine tuning of analog functions in the I/O blocks. These analog functions are difficult to test with an ATPG approach, making a thorough testing of the associated logic gates of the I/O blocks challenging. At the same time, it is desirable to achieve high test fault coverage of the logic gates in these I/O blocks. By utilizing testing features that are realized with minimal additional circuitry and that produce high fault-diagnosing results within short test times, significant improvements to the diagnostic capabilities within I/O blocks may be accomplished.

I/O blocks may be implemented in situations and have constraints imposed on them that increase the challenges to their diagnosis. For instance, the requirements on circuits in I/O blocks to produce consistent performance levels across generations of scaled semiconductor fabrication, can mean the amount of die area dedicated to performance can correspondingly reduce the area available to implement diagnostic circuits. I/O blocks typically have additional die area devoted to hardening against electrostatic discharge and additional devices for configuring receiver thresholds and drive-level characteristics to ensure input and output performance. Therefore, in the I/O blocks, the die area available to implement diagnostic circuitry may be significantly limited.

Figure 1A:
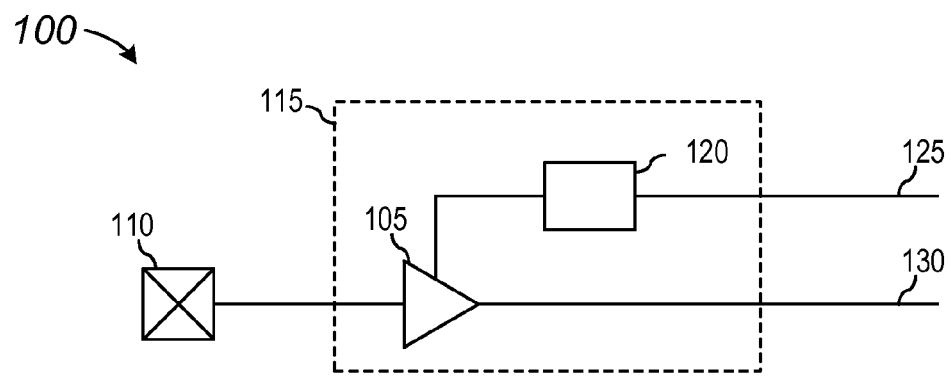
FIG. 1A is a block-level schematic diagram illustrating a configurable input block.

FIG. 1A is a block-level schematic diagram illustrating a configurable input block 100. An input buffer 105 is connected to an input pad 110 within an input cell 115. A configuration circuit 120 receives configuration commands from core logic (not shown) on a corresponding control line 125. The configuration commands configure the configuration circuit 120 to provide configuration signals to the input buffer 105. Once configured, an input signal applied to the input pad 110 causes the input buffer 105 to produce a signal on an input line 130 according to drive characteristics determined by the configuration signals applied to the input buffer 105.

The configuration signals provided by the configuration circuit 120 configure various electrical characteristics of the input buffer 105. These electrical characteristics can be configured for responding to input signals received from the input pad 110, as well as, for producing signal-related drive-strength characteristics on the input line 130. Configuration circuit 120 may configure input buffer 105 to have electrical characteristics including a voltage threshold for high-level-input signals ($VI_H$), a voltage threshold for low-level-input signals ($VI_L$), and output signal levels for a low-logic level ($VO_L$) and a high-logic level ($VO_H$). The input buffer 105 generates the output signal levels on the input line 130.

Figure 1B:
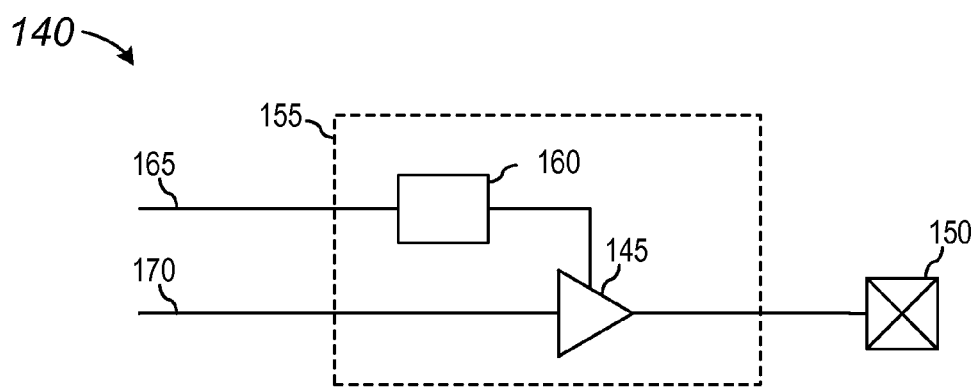
FIG. 1B is a block-level schematic diagram illustrating a configurable output block.

FIG. 1B is a block-level schematic diagram illustrating a configurable output block 140. An output buffer 145 is connected to an output pad 150 within an output cell 155. A configuration circuit 160 receives configuration commands from core logic (not shown) on control line 165. The configuration commands transmitted on the control line 165 configure circuitry within the configuration circuit 160 to generate configuration signals which are applied to various configuration and drive circuitry (not shown) within the output buffer 145. Once configured, a signal applied to the output buffer 145 on an output data line 170 generates an output signal to the output pad 150 according to drive characteristics determined by the configuration signals applied to the configuration and drive circuitry within the output buffer 145.

The configuration circuit 160 configures the various electrical characteristics of the output buffer 145 by generating configuration signals. These electrical characteristics can be configured for producing output signal levels and drive strengths to the output pad 150. For instance, configuration circuit 160 may configure output buffer 145 to have a low-logic-level-output voltage ($VO_L$) and a high-logic-level-output voltage ($VO_H$). Corresponding output drive strengths can be implemented as low-logic-level-current magnitude ($IO_L$) and high-logic-level-current magnitude ($IO_H$). The configuration circuit 160 activates various combinations of output drive devices according to the generated configuration signals. These configuration signals activate various combinations of output drive devices or transconductance devices, such as transistors, in the output buffer 145. The particular arrangement of transconductance devices activated by the configuration signals determines the output voltage and current characteristics of the output cell 155. Output signaling on the output pad 150 is determined by data signals applied through the output data line 170 and the corresponding drive characteristic may be determined by how many drive devices of output buffer 145 are enabled by the configuration signals.

Figure 1C:
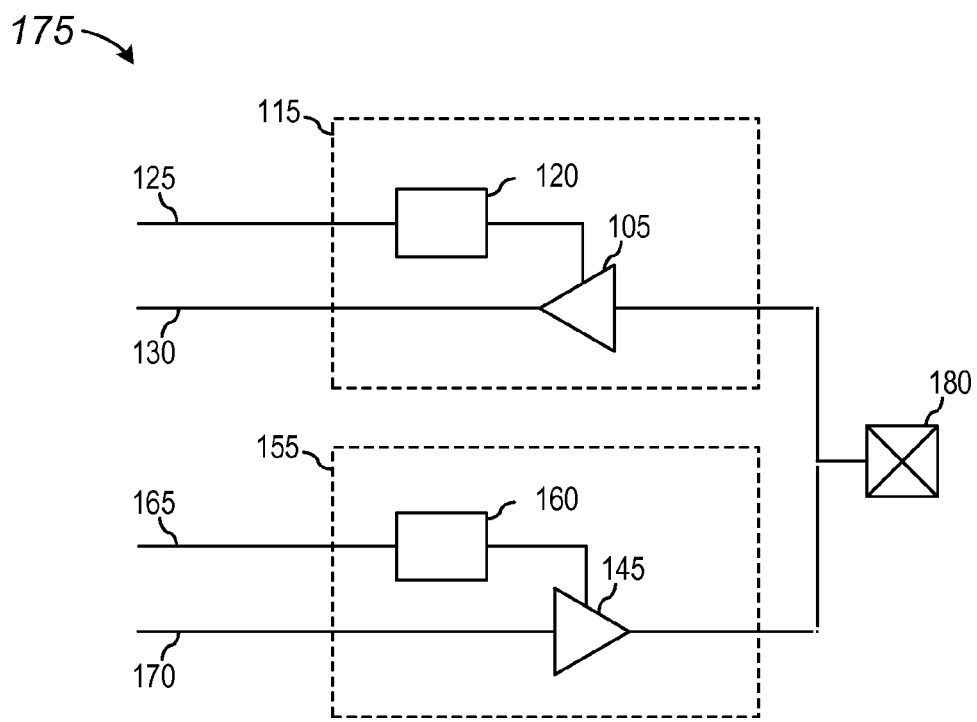
FIG. 1C is a block-level schematic diagram illustrating a configurable input/output block.

FIG. 1C is a block-level schematic diagram illustrating a configurable input/output block 175. The configurable input/output block 175 is the parallel combination of the configurable input block 100 and the configurable output block 140 connected to a bidirectional pad or I/O pad 180. The input buffer 105 and the output buffer 145 are arranged with their respective configuration circuits 120, 160 as described above with respect to FIGS. 1A and 1B. The core logic, mentioned above, may provide a signal to the output buffer 145 and produce an output signal to the I/O pad 180 during an output mode. The core logic may also place the output buffer 145 in a high-impedance mode (e.g., tri-state output mode) during an input mode when the input buffer 105 is configured to receive input signals applied to the I/O pad 180.

Figure 2:
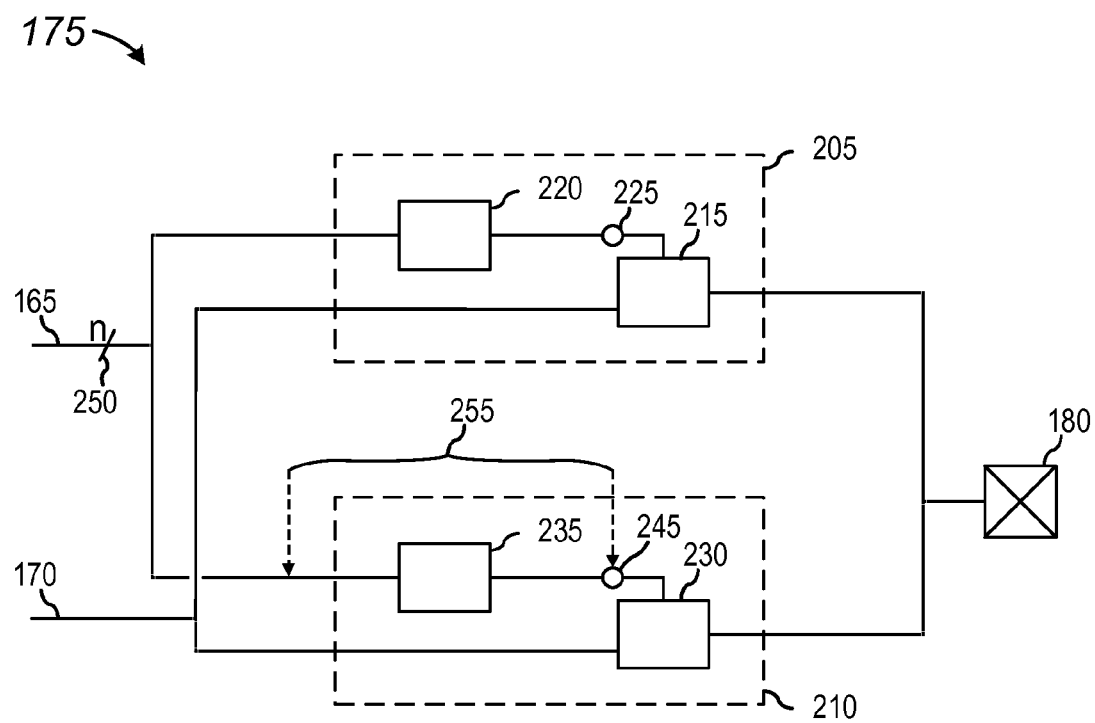
FIG. 2 is a block-level schematic diagram illustrating a configurable pull-up block and a configurable pull-down block corresponding to the output block of FIG. 1B.

FIG. 2 is a block-level schematic diagram illustrating a configurable pull-up block 205 and a configurable pull-down block 210 combination corresponding to the configurable input/output block 175 (FIG. 1C). The pull-up block 205 includes a pull-up component 215 and a pull-up configuration circuit 220. The pull-up configuration circuit 220 couples to the pull-up component 215 through a connection point, such as a pull-up control-path endpoint 225. The pull-down block 210 includes a pull-down component 230 and a pull-down configuration circuit 235. The pull-down configuration circuit 235 couples to the pull-down component 230 through a further connection point, such as a pull-down control-path endpoint 245.

The control lines 165 and the output data line 170 connect in parallel to the pull-up block 205 and the pull-down block 210. In other exemplary embodiments, the control lines may be provided independently to the pull-up configuration circuit 220 and the pull-down configuration circuit 235 to supply independent configuration capabilities to the pull-up component 215 and the pull-down component 230. The output data line 170 connects to the pull-up component 215 in the pull-up block 205 and to the pull-down component 230 in the pull-down block 210. The control lines 165 include at least one and may include up to "n" control lines 250, where "n" represents the highest numbered signal line making up the control lines 165. The control lines 165 connect to the pull-up configuration circuit 220 in the pull-up block 205 and to the pull-down configuration circuit 235 in the pull-down block 210.

In a fashion similar to that discussed above in regard to the configuration circuit 160 configuring the output buffer 145 (FIG. 1B), the pull-up configuration circuit 220 and the pull-down configuration circuit 235 receive configuration commands from the core logic on the control lines 165. The received configuration commands cause circuitry within the pull-up configuration circuit 220 and the pull-down configuration circuit 235 to respectively provide, configuration signals to the pull-up component 215 and the pull-down component 230. Accordingly, the configuration signals configure the pull-up electrical characteristics of the pull-up block 205 and the pull-down electrical characteristics of the pull-down block 210. In this way, the pull-up and the pull-down electrical characteristics may be configured independently and according to the configuration commands provided by the control lines 165.

In terms of determining diagnostic capabilities, the pull-up block 205 and the pull-down block 210 are fundamentally diagnostic mirror images of one another. Although the literal diagnostic requirements for the pull-up block 205 and the pull-down block 210 may differ from one another, the diagnostic capabilities discussed herein may conceptually apply equally to the two blocks in terms of the various exemplary embodiments presented. Accordingly, the pull-down block 210 is the focus of exemplary embodiments of diagnostic aspects further described below and the control path across the pull-down configuration circuit 235 denotes a representative test path 255 of interest.

Figure 3A:
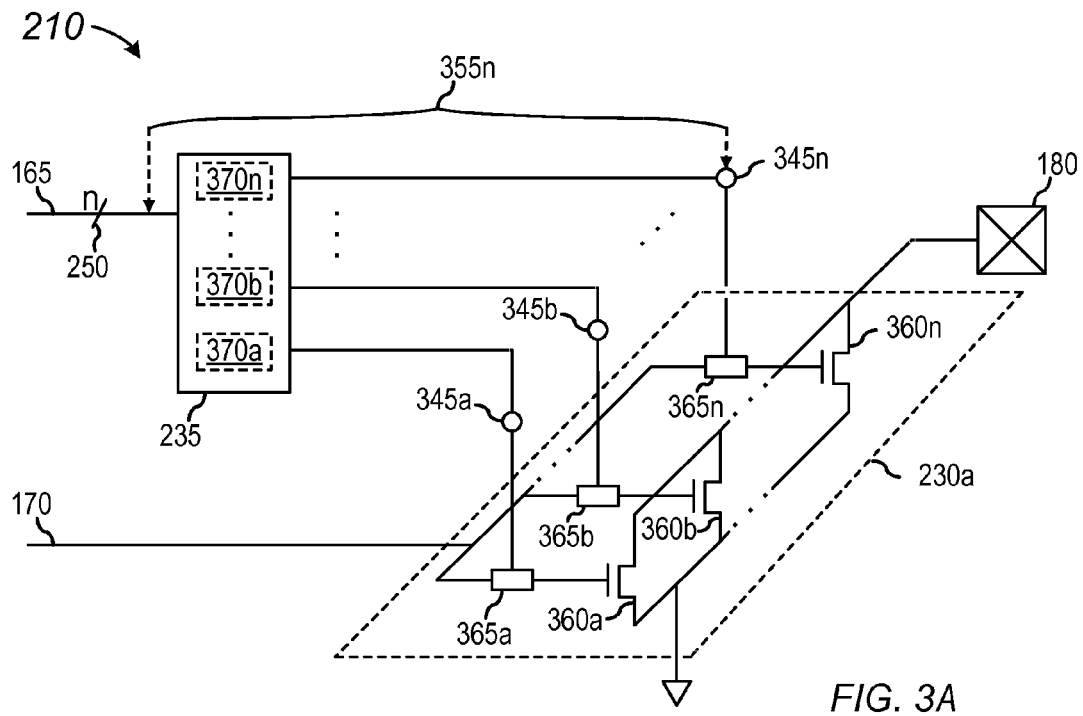
FIG. 3A is a block-level schematic diagram illustrating a pull-down configuration circuit and a drive component according an embodiment of the pull-down block of FIG. 2.

FIG. 3A is a block-level schematic diagram illustrating a pull-down configuration circuit 235 and a pull-down component 230a of the pull-down block 210 (FIG. 2). The pull-down component 230a may include drive devices 360a, 360b, 360n coupled to the output data line 170 by configuration devices 365a, 365b, 365n. The pull-down configuration circuit 235 may include configuration circuits 370a, 370b, 370n. The configuration circuits 370a, 370b, 370n couple through connection points, such as the pull-down control-path endpoints 345a, 345b, 345n, to the configuration devices 365a, 365b, 365n. The $n^{th}$ test path 355n extends from the control lines 165 to the $n^{th}$ pull-down control-path endpoint 345n. The configuration devices 365a, 365b, 365n may be, for example, series-connected transconductance devices or transistors, such as field-effect transistors (FETs) connected in series between the output data line 170 and the drive devices 360a, 360b, 360n, with respective gate terminals coupled to the pull-down control-path endpoints 345a, 345b, 345n. The configuration devices 365a, 365b, 365n may be further types of transistors, such as, bipolar junction transistors (BJTs), junction field-effect transistors (JFETs), or insulated-gate field-effect transistors (IGFETs), such as, enhancement-mode metal-oxide-semiconductor FETs (MOSFETs), and depletion-mode MOSFETs.

Figure 3B:
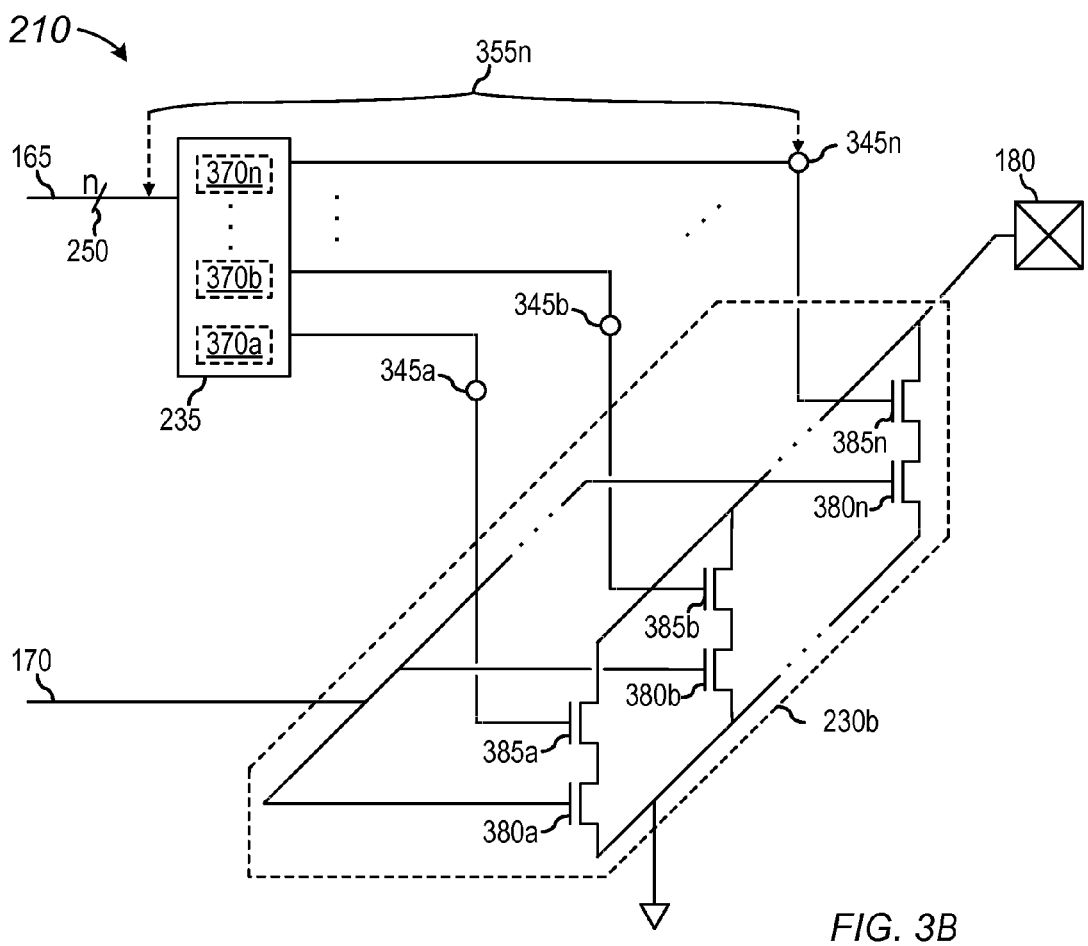
FIG. 3B is a block-level schematic diagram illustrating a pull-down configuration circuit and a further embodiment of the pull-down component of the pull-down block of FIG. 2.

FIG. 3B is a block-level schematic diagram illustrating a pull-down configuration circuit 235 and a further embodiment of the pull-down component 230b of the pull-down block 210 (FIG. 2). The pull-down configuration circuit 235 may include configuration circuits 370a, 370b, 370n arranged similarly to the configuration described above in regard to FIG. 3A. The configuration circuits 370a, 370b, 370n may couple through connection points, such as the pull-down control-path endpoints 345a, 345b, 345n, to the configuration devices 385a, 385b, 385n. The configuration devices 385a, 385b, 385n and drive devices 380a, 380b, 380n may be, for example, series-connected transconductance devices or transistors, such as FETs.

According to some example embodiments, the configuration devices 385a, 385b, 385n and drive devices 380a, 380b, 380n may be n-type metal-oxide-semiconductor (NMOS) FETs. The configuration devices 385a, 385b, 385n may be connected in series between the bidirectional pad or I/O pad 180 and respective instances of the drive devices 380a, 380b, 380n. For each instance of the configuration devices 385a, 385b, 385n, a drain terminal may be communicatively coupled to the bidirectional pad or I/O pad 180 and a respective source terminal may be communicatively coupled to a drain terminal of a corresponding drive device 380a, 380b, 380n. Source terminals of the drive devices 380a, 380b, 380n may be coupled to Ground. The $n^{th}$ test path 355n may extend from the control lines 165 to the $n^{th}$ pull-down control-path endpoint 345n. The pull-down control-path endpoints 345a, 345b, 345n may couple to respective gate terminals of the configuration devices 385a, 385b, 385n within the pull-down component 230b. The pull-down component 230b may include drive devices 380a, 380b, 380n having respective gate terminals coupled to the output data line 170. According to some exemplary embodiments, the positions of the configuration devices and the drive devices may be swapped with one another yet still form a logically equivalent series drive connection.

In further regard to FIGS. 3A and 3B, configuration commands may be provided from the core logic to the pull-down configuration circuit 235 by the control lines 165. The configuration commands generate respective configuration signals from the configuration circuits 370a, 370b, 370n. The configuration signals are provided to the configuration devices 365a, 365b, 365n and 385a, 385b, 385n.

The pull-down drive-strength ($IO_L$) produced at the bidirectional pad or I/O pad 180 is determined by the number of the drive devices 360a, 360b, 360n and 380a, 380b, 380n enabled by the configuration signals provided to the configuration devices 365a, 365b, 365n and 385a, 385b, 385n. For example, if configuration commands on the control lines 165 determine that a single configuration signal is provided by the first configuration circuit 370a to the first configuration device 365a (FIG. 3A), then the first drive device 360a will be activated by an appropriate data signal on the output data line 170. This results in a single-device drive strength being provided to the bidirectional pad or I/O pad 180. By further example, additional configuration commands on the control lines 165 may cause further members of the configuration circuits 370a, 370b, 370n to generate respective configuration signals to the configuration devices 365a, 365b, 365n and the pull-down drive strength will be increased according to the number of the drive devices 360a, 360b, 360n and 380a, 380b, 380n activated. Activation of the drive devices 360a, 360b, 360n and 380a, 380b, 380n may occur according to data signals coupled from the output data line 170 and through the configuration devices 365a, 365b, 365n and 385a, 385b, 385n activated by the configuration signals.

FIGS. 3A and 3B are directed to pull-down configuration circuits and pull-down components, including corresponding drive devices coupled to an output data line, the discussions regarding configurability by configuration circuits and the pull-down capabilities of certain components and drive devices may equally apply to the configurable pull-up block 205 and the pull-up configuration circuit 220 (FIG. 2). The pull-up characteristics, capabilities, and various components may be the complement of the characteristics, capabilities, and components of the pull-down embodiments described herein.

Figure 4:
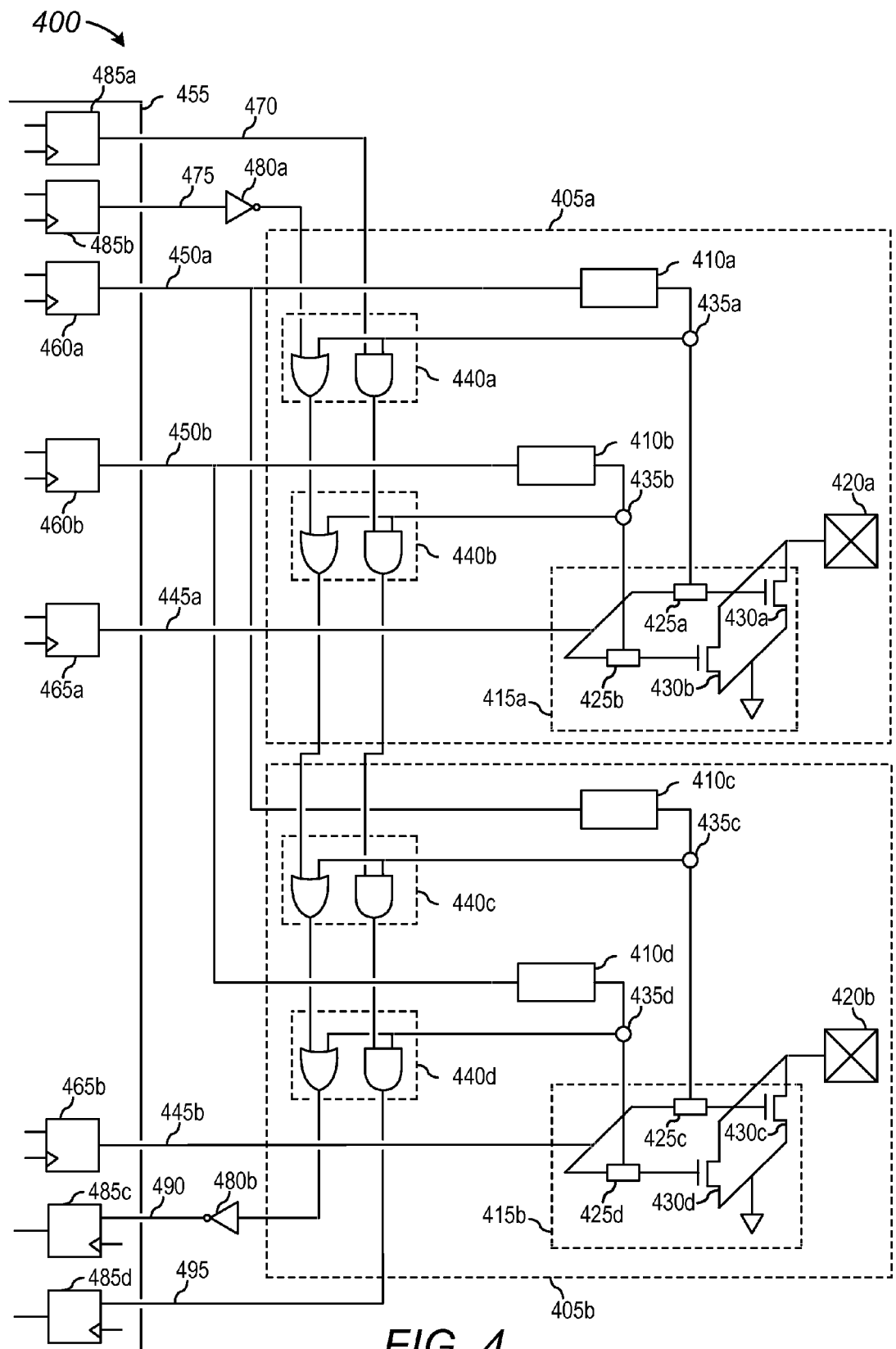
FIG. 4 is a gate-level schematic diagram illustrating a serial test chain cascaded across endpoints in configurable pull-down blocks, according to an example embodiment.

FIG. 4 is a gate-level schematic diagram illustrating a sequence of I/O blocks 400 including a serial test chain cascaded across endpoints in configurable pull-down blocks, according to an example embodiment. Configurable output blocks 140 (FIG. 1B) or "configurable pull-down blocks" may be implemented as an interface circuit 405a,b. According to the present exemplary embodiment, pull-down electrical characteristics are discussed with regard to the aspects of cascaded test chains for stuck-at fault verification. The pull-up electrical characteristics may be similarly determined, as discussed above in regard to the pull-up block 205 (FIG. 2). Although the following discussions center around an exemplary embodiment of configurable pull-down blocks, the first and the second interface circuits 405a,b of the present exemplary embodiment may generally represent similar implementations of configurable interface blocks, such as the configurable input block 100 (FIG. 1A), the configurable output block 140 (FIG. 1B), and the configurable input/output block 175 (FIG. 1C). The following discussions about the application of configuration commands, data signals, and test modes to interface circuits and diagnostic circuits to effect fault determination may similarly apply to further exemplary embodiments of the configurable interface blocks discussed above.

For example, although the following discussions are directed to configurable pull-down blocks within the first and the second interface circuits 405a,b of the present exemplary embodiment, these discussions and presentations may also be generally representative of an interface circuit as utilized in the configurable input/output block 175 and the configurable input block 100. The configurable pull-down blocks described below may be representative of configurable pull-up blocks and configuration circuits described above in relation to the configurable input/output block 175 and the configurable input block 100 respectively. The pull-down characteristics and the configurability of those characteristics by the configurable pull-down blocks, configuration commands, and configuration signals described below may also be generally descriptive, in a complementary sense, of the pull-up elements and corresponding configuration commands and configuration signals of the pull-up block 205 and the configurable input/output block 175. The configurability of the configurable input block 100 and input portion of the configurable input/output block 175 may also be similarly described, where instead of output drive characteristics and drive strengths, input receiving sensitivity may be configured according to various arrangements of input devices configured according to the same sense of configuration commands and configuration signals.

Interface circuits 405a,b (FIG. 4) may represent at least a portion of interface circuitry that may be involved in the transmission of interface signals between semiconductor devices. Generally, interface circuits may interface from a first semiconductor device to a second semiconductor device by transmitting and receiving interface signals. The interface circuits may propagate the interface signals through bonding pads (pads) arranged on the surface of the semiconductor devices. The bonding pads may typically be arranged at the periphery of the die. According to some exemplary embodiments, the bonding pads may be variously arrayed across the interior surface of the die.

The interface circuits may be coupled to the bonding pads so that the interface signals may be transmitted from the first semiconductor device to the second semiconductor device through electrical connections between the bonding pads. The interface circuits generate the interface signals by pulling the electric potential of the bonding pad to a corresponding source (e.g., source voltage). The interface circuit pulls the electric potential of the bonding pad to a corresponding source voltage according to the drive characteristic. The drive characteristic or drive strength may be determined by the current carrying capability of the drive devices contained within the interface circuit. The drive characteristic determined by the configured drive strength may be thought of as the impedance through which the electric potential the bonding pads is pulled to a corresponding source voltage. The interface circuits may include complementary pairs of drive components that pull the electric potential of the bonding pad to complementary source voltages to generate the interface signals with logic levels that correspond to input data "1s" and "0s."

Additionally, the interface circuits may be communicatively coupled such that interface signals may be received by the first semiconductor device from the second semiconductor device. By symmetry, and in a complementary sense, the transmission and reception of the interface signals may be implemented reciprocally between the first semiconductor device and the second semiconductor device to achieve bidirectional communication by the transmission and receipt of interface signals between the interface circuits in the first and the second semiconductor devices. Accordingly, the transmission and receipt of interface signals between the interface circuits of the first semiconductor device and the second semiconductor device may achieve an interface between the two die.

The first and the second interface circuits 405a,b may include configuration circuits 410a,b and 410c,d communicatively coupled to drive components 415a and 415b, respectively. The drive components 415a and 415b may be communicatively coupled to output pads 420a and 420b, respectively. The first set of the configuration circuits 410a,c and the second set of the configuration circuits 410b,d may be communicatively coupled to a first configuration line 450a and a second configuration line 450b, respectively. A control circuit 455 may generate configuration commands on the first and the second configuration lines 450a and 450b. The configuration storage blocks 460a,b maintain a logical state of the configuration commands by storing a logic level of a respective bit of a configuration command.

The drive components 415a and 415b include configuration devices 425a,b and 425c,d coupled to a first and a second data lines 445a,b, respectively. The control circuit 455 may generate output data signals on the first and the second data lines 445a,b from data storage blocks 465a,b. The configuration devices 425a,b and 425c,d are communicatively coupled to the output pads 420a and 420b through first and second sets of drive devices 430a,b and 430c,d, respectively. The configuration circuits 410a,b and 410c,d are communicatively coupled through connection points, such as endpoints 435a,b and 435c,d, to the configuration devices 425a,b and 425c,d. The configuration devices 425a,b and 425c,d may be, for example, series-connected transconductance devices or transistors, such as FETs, connected in series between the first and the second data lines 445a,b and the first and the second sets of drive devices 430a,b and 430c,d, with respective gate terminals coupled to the endpoints 435a,b and 435c,d.

In further exemplary embodiments, the drive components and the configuration devices of interface circuits may be arranged with configuration devices connected in series between an output pad and respective instances of drive devices in a fashion similar to that described above in relation to the pull-down component 230b (FIG. 3B). For example, for each instance of a configuration device, implemented as a metal-oxide-semiconductor FET (MOSFET), a drain terminal may be communicatively coupled to the output pad and a respective source terminal may be communicatively coupled to a drain terminal of a corresponding drive device. The combination of pairs of associated configuration devices and drive devices may be referred to as a "leg." The drive devices may have source terminals coupled to Ground and gate terminals coupled to an output data line (e.g., the first and the second data lines 445a,b). According to some exemplary embodiments, the positions of the configuration devices and the drive devices may be swapped with one another yet still form a logically equivalent series drive connection. Data signals transmitted to the drive components through the data line may cause the drive component to generate interface signals and transmit them off of a semiconductor die to a further semiconductor die through the output pad.

Certain exemplary embodiments of drive components may utilize multiple legs of drive devices and configuration devices arranged in parallel between the output pad and a source, such as Vdd, Vss, or Ground. A drive component may be utilized to pull the electric potential of the pad to the source voltage Vdd and a further drive component may be utilized to pull the electric potential of the pad to the source voltage Vss. Pairs of drive components may be utilized in complementary combinations to pull the electric potential of the pad to either a Vdd or Vss source voltage according to the data coupled to the drive components.

The strength by which the drive component pulls the electric potential of the pad to a respective source voltage may be determined according to a drive characteristic of the drive component. Certain arrangements of configuration signals may be utilized to achieve a particular drive characteristic of the drive components. Each leg of drive devices and configuration devices may be independently enabled or "activated" according to the configuration signals. The drive devices may be selectively and independently activated according to corresponding configuration devices and accordingly determine the drive characteristic. The drive characteristic configured by the configuration devices may determine the impedance through which the electric potential of the pad is pulled to the corresponding source. In such cases, the drive characteristic is the impedance of the drive component.

A configuration signal applied to the configuration device of a given leg may enable activation of the corresponding drive device in parallel with any other activated legs of the drive component. The configuration signals may be configured and applied to provide independent activation of any one of the legs. The drive strength or drive characteristic of a given leg may be determined by the width of the conductive channel of the transconductance devices. Each leg of drive devices and configuration devices may utilize various and independent conductive channel widths of respective transconductance devices, which may be MOSFETs. The conductive channel of the transconductance devices may be the aggregate or total number of conductive channel widths of the drive devices activated in parallel among the total number of parallel legs communicatively coupled between the output pad and the corresponding source. The conductive channel determined by the aggregate of drive device conductive channel widths determines the drive characteristic or drive strength. The activated portion of drive devices may determine the drive characteristic by which the drive components pull the electric potential of the output pad to the corresponding source.

AND gates and OR gates are combined to make diagnostic circuits 440a,b,c,d and are cascaded across the first and the second interface circuits 405a,b to form a test chain of combinatorial logic devices or a "serial test chain." The AND/OR gate combinations implementing the diagnostic circuits 440a,b,c,d require no sequential logic or storage elements to implement the serial test chain. As a result, the serial test chain is not scanned-based and does not require any clocking logic to support the diagnostic capabilities provided. The lack of clocking logic to implement the serial test chain means that no device area is required to implement a scan clock in the serial test chain implementation. This feature may be especially valuable in I/O cells where device area is at a premium for basic operation and drive characteristic configuration, let alone for support of diagnostic capabilities. Due to the constraints placed on I/O blocks in regard to die area available to implement diagnostic circuitry, there is typically little or no testing circuitry available to implement the complexities involved in implementing a complete boundary-scan architecture. It is desirable to test the control circuitry that produces the configuration of electrical characteristics of I/O blocks is with a minimum of circuitry.

Each of the diagnostic circuits 440a,b,c,d is coupled to a corresponding one of the endpoints 435a,b,c,d. A test-all-ones terminal 470 is coupled to the AND gate and a test-all-zeros terminal 475 may be coupled through a first inverter 480a to the OR gate of the first diagnostic circuit 440a of the test chain. The control circuit 455 generates test signals at the outputs of a first set of test storage blocks 485a,b according to a test mode being applied to the interface circuits 405a,b. The test signals may represent a test state indication and are correspondingly provided to the test-all-ones terminal 470 and the test-all-zeros terminal 475 at a first interface circuit 405a. An all-zeros-out terminal 490 is coupled through a second inverter 480b to the OR gate and an all-ones-out terminal 495 is coupled to the AND gate of the last diagnostic circuit 440d of the test chain. Test chain output signals are provided to the control circuit 455 by the all-zeros-out terminal 490 and the all-ones-out terminal 495 by a second set of test storage blocks 485c,d. The first set of test storage blocks 485a,b and the second set of test storage blocks 485c,d may be implemented with flip-flops.

The control circuit 455 and portions thereof may operate as a control circuit or control means and be referred to as "core logic." The control circuit 455 may be configured to generate data signals, configuration commands (control signals), and a set of test modes. The test modes may be realized as test commands or test signals in various alternative embodiments. The control circuit 455 may provide the data signals and the configuration commands to the interface circuits 405a,b. The control circuit 455 may include particular circuitry (not shown) functioning to generate a test state indication in the form of test signals as part of a test mode. The test state indication is generated as respective test signals at the test-all-ones terminal 470 and the test-all-zeros terminal 475. A test state indication and the respective test signals may be considered, for example, to be synonymous with one another. For example, a portion of a test state indication may be a signal. The control circuit 455 may also operate to receive a test response as test result indications at the all-zeros-out terminal 490 and the all-ones-out terminal 495. The control circuit 455 may modify test commands and introduce changes in the test signals and configuration commands applied to the test-all-ones terminal 470 and the test-all-zeros terminal 475. The control circuit 455 may introduce these changes by applying updated signals corresponding to the configuration commands on the first configuration line 450a and the second configuration line 450b.

The interface circuits 405a,b may be selectively configured according to the configuration commands to generate a set of configuration signals. The interface circuits 405a,b may also be configured to generate interface signals based on the data signals produced by the control circuit 455. The interface signals may be produced by the interface circuits 405a,b on the output pads 420a and 420b. Configuration signals are generated from the configuration circuits 410a,b and 410c,d and are provided to the configuration devices 425a,b and 425c,d to determine the output electrical characteristics of signals generated by the first and the second interface circuits 405a,b to the output pads 420a and 420b. The interface signals may be a reproduction of the data signals at corresponding ones of the output pads 420a and 420b. The interface signals may be a logical reproduction of the data signals or be a logical derivative, such as the inverse, of the data signals. The interface signals may determine a drive characteristic, such as a drive strength or current carrying capability. The configuration commands may determine the interface signals applied to the device configuration circuitry.

Output electrical drive characteristics are determined according to the particular drive devices 430a,b and 430c,d that are enabled by the configuration signals. Although FIG. 4 depicts two devices in each of the first and the second sets of drive devices 430a,b and 430c,d in each of the drive components 415a and 415b, further exemplary embodiments may be implemented by utilizing more than two drive devices in each drive component or use different numbers of drive devices in respective instances of drive components. The sizes of the drive devices may determine a drive characteristic, such as a drive strength or current producing capability, that may be provided to the output pads 420a and 420b. This current producing capability may be thought of as the impedance through which the drive devices provide current to the output pads 420a and 420b. For example, a larger device size may indicate a greater amount of die area being devoted to device geometries capable of conducting current across terminals of the drive device and correspondingly produce a greater drive strength (i.e., lower impedance) at the output pads 420a and 420b. The sizes of the respective drive devices in the first and the second sets of drive devices 430a,b and 430c,d may differ and be independent of one another, such that the first drive device (e.g., the first drive device 430a) is larger than the second drive device (e.g., the first drive device 430b). Accordingly, the first drive device may conduct more current than the second device.

The configuration commands generated by the control circuit 455 to the configuration circuits 410a,b and 410c,d determine the configuration signals generated from the configuration circuits 410a,b and 410c,d. The configuration storage blocks 460a,b may buffer and/or latch the configuration commands and are typically part of a scan chain. Here, the term scan chain refers to a scan-based or boundary-scan technology, which differs from the combinatorial test chain described here. Therefore, the circuitry providing the configuration commands on the first and the second configuration lines 450a and 450b will typically have been verified using scan chains as part of a scan path in the control circuit 455 during a portion of a previous testing regimen. The configuration commands provided to the configuration circuits 410a,b and 410c,d in the first and the second interface circuit 405a,b may be considered to be fault-free according to such prior testing. The boundary-scan architecture, standardized by the Joint Test Action Group (JTAG) as part of the Institute of Electrical and Electronics Engineers (IEEE), is an example of such a scan-based testing scheme.

The interface circuits 405a,b may include at least one configuration circuit 410a,b and 410c,d, each of which may be communicatively coupled to the control circuit 455 and a respective one of the diagnostic circuits 440a,b,c,d. According to the present exemplary embodiment the configuration circuits 410a,b and 410c,d receive the configuration commands. The configuration circuits 410a,b and 410c,d may be representative of at least a portion of any configurable logic or as control blocks, such as the pull-up configuration circuit 220 or the pull-down configuration circuit 235 (FIG. 3A) in further example embodiments. Any of these implementations of configurable logic or control blocks may be in receipt of configuration commands, such as those described below, and correspondingly be configured for establishing certain drive characteristics within the associated interface circuit. The example behaviors described below in regard to configuration commands and their configuration of the configuration circuits 410a,b and 410c,d may generally apply to further exemplary embodiments of configurable logic or control blocks as used in interface circuits.

The interface circuits 405a,b may be selectively configured to generate configuration signals according to the configuration commands generated by the control circuit 455. Each of the interface circuits 405a,b may also include a corresponding one of the drive components 415a and 415b communicatively coupled to the control circuit 455. Each of the drive components 415a and 415b may include a corresponding one of the first or second sets of drive devices 430a,b and 430c,d. The first or second sets of drive devices 430a,b and 430c,d may be communicatively coupled through a corresponding one of the configuration devices 425a,b and 425c,d to an associated one of the configuration circuits 410a,b and 410c,d The drive components 415a and 415b may be communicatively coupled to a corresponding one of the configuration circuits 410a,b and 410c,d through associated configuration devices 425a,b and 425c,d to receive the configuration signals. The configuration signals may be provided to the configuration devices 425a,b and 425c,d to selectively activate certain of the configuration devices 425a,b and 425c,d and correspondingly provide conductive paths through certain ones of the corresponding drive devices 430a,b and 430c,d. Data signals applied to activated drive components 415a and 415*b* generate the interface signals. The configuration signals selectively activate certain of the drive devices 430*a,b* and 430*c,d* and form a drive configuration. This drive configuration determines the drive characteristic of the interface signals generated by the drive devices 430*a,b* and 430*c,d*. In this way, the drive components 415*a* and 415*b* are selectively configured to generate the interface signals according to the data signals and with a drive characteristic determined by the configuration signals applied to the drive devices 430*a,b* and 430*c,d*.

The diagnostic circuits 440*a,b,c,d* may be communicatively coupled to the control circuit 455 and the interface circuit and selectively configured to receive a test state indication. A particular test mode may come from the control circuit 455, as a portion of the set of test modes. The diagnostic circuits 440*a,b,c,d* may be configured according to the test state indication to acquire a portion of the set of configuration signals.

The diagnostic circuits 440*a,b,c,d* are implemented as configurations of combinatorial logic gates (e.g., AND gates and OR gates). These configurations provide a combined function of an acquisition circuit or acquisition means and a diagnostic circuit or diagnostic means. The first inputs of the AND gate and the OR gate are coupled to the endpoints 435*a,b* and 435*c,d* and function as acquisition circuits since logic level signals produced on the endpoints 435*a,b* and 435*c,d* are acquired at the first inputs of the respective combinatorial gates for logical combining with further signals applied to the further inputs of the respective combinatorial gates. For example, the second inputs of the first AND gate and the first OR gate are coupled to the test-all-ones terminal 470 and the test-all-zeros terminal 475 in the first diagnostic circuit 440*a*.

The first diagnostic circuit 440*a* forms a first stage of the test chain. Successive stages of the test chain are formed from the further diagnostic circuits 440*b,c,d* and have the second inputs of their respective AND gates and OR gates coupled to a corresponding output of the previous stage of the test chain (i.e., a previous one of the diagnostic circuits 440*a,b,c*). The cascading of successive stages of the test chain in this way allows a logic level acquired from one of the endpoints 435*a,b* and 435*c,d* by a previous stage of the test chain to be propagated through the test chain and combined with a logic level of a further one of the endpoints 435*a,b* and 435*c,d* in the present stage. The present stage of the test chain performs a diagnostic function according to the capability of combining a logic level from a previous stage of the test chain with a logic level acquired in the present stage of the test chain. In this way, the present stage of the test chain propagates a logic level that includes a diagnostic analysis of a logic level from a previous stage with the logic level acquired from the present stage. Each of the diagnostic circuits 440*a,b,c,d* makes up a stage of the test chain and performs a combined function of acquisition and diagnosis across the interface circuits 405*a,b*. The amalgamation of the diagnostic circuits 440*a,b,c,d* in a cascaded chain provides the capability to propagate the diagnostic indications to the control circuit 455.

These diagnostic capabilities may be realized as the diagnostic circuits 440*a,b,c,d* propagate the test state indication when the first portion of the configuration signals corresponds to the test state indication. The diagnostic circuits 440*a,b,c,d* may diagnose one of the configuration circuits 410*a,b* and 410*c,d* by utilizing the included combinatorial logic gates to perform a comparison of the first portion of the configuration signals and a test state indication. For example, when one of the configuration circuits 410*a,b* and 410*c,d* generates a configuration signal on an output, an associated one of the diagnostic circuits 440*a,b,c,d* may acquire the logic level of the generated configuration signal.

According to certain example embodiments, the control circuit 455 may supply a logic level "1" to a particular one of the configuration circuits 410*a,b* and 410*c,d* as a portion of a configuration command during a test mode. The logic level "1" may in turn cause a logic level "1" to be produced at an output of the configuration circuit 410*a,b* and 410*c,d*. The test mode may also cause a logic level "1" to be generated as a particular portion (i.e., a single bit) of a corresponding test state indication. The associated diagnostic circuit 440*a,b,c,d* may then compare the logic level "1" of the test state indication with the logic level "1" of the configuration signal. The AND gate portion of the diagnostic circuit 440*a,b,c,d* may combine and compare the two logic level "1s" and generate a further logic level "1" as an output logic level to be propagated to the next stage of the test chain. In this way, a correctly operating configuration circuit 410*a,b* and 410*c,d* generates a correct portion of the configuration signals that in turn enables the propagation of the test state indication to a successive stage of the test chain where this comparison process may be continued. When each of the stages of the test chain have diagnostic circuits 440*a,b,c,d* propagating the test state indication, each of the corresponding configuration circuits 410*a,b* and 410*c,d* is diagnosed as functional.

In the event that one of the configuration circuits 410*a,b* and 410*c,d* is faulty, the bad configuration circuit 410*a,b* and 410*c,d* may generate a logic level "0" at the output. The AND gate portion of the diagnostic circuit 440*a,b,c,d* may combine and compare the logic level "0" from the faulty configuration circuit 410*a,b* and 410*c,d* with the logic level "1" of the test state indication and generate a further logic level "0" at an output of the diagnostic circuit 440*a,b,c,d*. This condition does not propagate the test state indication to a successive stage of the test chain. Rather, the further logic state propagated, being a logic level "0," is the complement of the correct test state indication and is an indication of the diagnosis of a fault. Consequently, the diagnostic result is the reporting of a fault condition being present in one of the configuration circuits 410*a,b* and 410*c,d*. In this case, the configuration circuits 410*a,b* and 410*c,d* are diagnosed as faulty.

According to some example embodiments, a further configuration command is generated by the control circuit 455 and provided to at least one of the configuration circuits 410*a,b* and 410*c,d*. For example, a configuration command signal may be a logic level "1" during a first portion of the test mode and changed by the control circuit 455 to a logic level "0" during a further portion of the test mode. The at least one of the configuration circuits 410*a,b* and 410*c,d* generates a further portion of the configuration signals according to the change in the further configuration command input. The at least one configuration circuit 410*a,b* and 410*c,d* may generate a logic level "0" corresponding to the configuration command signal changing to a logic level "0" at an input to the at least one configuration circuit 410*a,b* and 410*c,d*.

The corresponding at least one diagnostic circuit 440*a,b,c,d* further diagnoses the at least one configuration circuit 410*a,b* and 410*c,d* according to a comparison of the further portion of the configuration signals and the test state indication. For example, the at least one diagnostic circuit 440*a,b,c,d* acquires the logic level "0" being generated by the at least one configuration circuit 410*a,b* and 410*c,d* according to the configuration command signal being applied at a logic level "0." The test state indication continues to cause a logic level "1" to be applied to the at least one diagnostic circuit 440*a,b,c,d*. The AND gate portion of the at least one diagnostic circuit 440*a,b,c,d* in a corresponding stage of the test chain generates a logic level "0" according to a comparison of the logic level "0" acquired from the at least one configuration circuit 410a,b and 410c,d and the logic level "1" of the test state indication.

The at least one diagnostic circuit 440a,b,c,d diagnoses a fault within the at least one configuration circuit 410a,b and 410c,d in the event the corresponding stage of the test chain generates a logic level "1." Generally, the at least one diagnostic circuit 440a,b,c,d diagnoses a fault within the at least one configuration circuit 410a,b and 410c,d when the further portion of the configuration signals is the same as the first portion of the configuration signals.

The configuration commands are generated from portions of the control circuit 455 that may have been verified by further test schemes and therefore include logic levels being applied to the configuration devices 425a,b and 425c,d that have a high degree of probability of being correct. The high degree of confidence in the configuration commands input to the configuration circuits 410a,b and 410c,d may provide a high degree of confidence when the output signals from the configuration circuits 410a,b and 410c,d compare favorably to expectations. The comparison of the configuration commands and the configuration signals may be based on a fault model derived for the configuration circuits 410a,b and 410c,d. The fault model may be based on the structure of the circuitry included in the configuration circuits 410a,b and 410c,d and consider the possible failures of gates, devices (e.g., transistors), and interconnects that make up the configuration circuits 410a,b and 410c,d.

The endpoints 435a,b and 435c,d, are located at the outputs of the configuration circuits 410a,b and 410c,d. The cascading of a test chain across the endpoints 435a,b and 435c,d gives access to the configuration signals being provided to the configuration devices 425a,b and 425c,d in the drive components 415a and 415b. A comparison of the configuration commands with the captured signals at the endpoints 435a,b and 435c,d may provide a high degree of confidence that the configuration circuits 410a,b and 410c,d are operating properly and providing a correct configuration of the output electrical characteristics.

In the different embodiments there may be direct or implied coherence between the configuration commands and the configuration signals. For example, according to both the discussion and the figures of the present and further example embodiments, it may appear as though the configuration circuits 410a,b and 410c,d are implemented from non-inverting buffers or by circuitry that reduces to a logical equivalence of non-inverting buffers. However, the configuration circuits 410a,b and 410c,d may include complex circuitry involved in transforming the configuration commands to a proper constellation of configuration signals. For example, a plurality of configuration lines may be provided to configuration circuits generally and carry signals having encoded values that the logic within the configuration circuits decodes into particular sets of configuration signals provided to the configuration devices.

Configurable I/O blocks may address different signaling/interface standards, variations in output voltage and current drive-levels, variations in pull-up characteristics vs. pull-down characteristics, and slew rate control. Input receiver buffers may recognize input voltages corresponding with configurable voltage levels, utilize input impedance control, level shifting, and address different signaling/interface standards. Although as stated, the present example embodiments center around output pull-down electrical characteristics, the same principles of the observability and controllability of control logic and the corresponding comparison of signal levels across control logic may be utilized to diagnose stuck-at faults within the circuitry of the configuration circuits. The diagnosis of the particular configuration circuits 410a,b and 410c,d discussed herein may adequately represent the diagnosis of the various circuits, drive levels, and receiver capabilities presented here.

Additionally, logic blocks generally located within I/O blocks may contain delay elements or delay lines, voltage references, comparators, sequential logic, and combinatorial logic. Delay elements can delay an input signal so that the input configuration command is applied to a first output drive device at a first time and a delayed version of the input configuration command is applied to a second output device at a later time. This delay may mean for example, that the output drive capability is varied over the output rise or fall time and may effectively adjust slew rate of the output signal. The amount of delay may be programmable in order to configure different output slew rates. Programmable delay amounts may be utilized with inputs (e.g., receivers) that impose particular slew rate conditions. Multiple delay elements may be provided in sequence so that various and distinct output drive devices may be triggered at a succession of delay times.

A simple one-to-one correspondence between configuration commands and configuration signals is presented here to present a concise description of the aspects of test chains presented in these example embodiments. Comparisons across the configuration circuits of input configuration commands with the output configuration signals reveals stuck-at faults according to the context and conditions as revealed in particular example embodiments. The diagnostic principles discussed herein may be applied to configuration circuits containing various configurations of the above-mentioned circuitry to implement capabilities to alter input and output electrical characteristics as described above. The following discussions in regard to elements within a configuration circuit for example, are not to be considered limiting to the particular configuration circuit embodied by example, but rather are indicative of the example situations and circuitry described above.

In further regard to FIG. 4, the test chain is created by a succession of the diagnostic circuits 440a,b,c,d being connected in a serial fashion. This serial test chain, when cascaded across I/O blocks, provides observability of stuck-at faults at the endpoints 435a,b and 435c,d. When the test chain is coupled to the test-all-ones terminal 470, the test-all-zeros terminal 475, the all-zeros-out terminal 490, and the all-ones-out terminal 495, the serial test chain (combinatorial test chain) described herein may work in conjunction with the ATPG and the scan-based testing regime already provided in the control circuit 455. For instance, the first set of test storage blocks 485a,b and the second set of test storage blocks 485c,d may be implemented with flip-flops that are part of a scan-based testing technology utilized in the control circuit 455.

Register elements in addition to those already present in the control circuit 455 may be utilized in conjunction with control structures (not shown) and with extensions to ATPG routines to effectively test for stuck-at faults in the configuration circuits 410a,b and 410c,d. The first set of test storage blocks 485a,b and the second set of test storage blocks 485c,d may be accessed according to ATPG routines to be programmed with test states, configuration commands, and expected test results (in the case of the second set of test storage blocks 485c,d) to facilitate testing of the configuration circuits 410a,b and 410c,d discussed herein.

For instance, an ATPG routine may program configuration storage blocks 460a,b and the first test storage block 485a with a logic level "1" and expect to see a logic level "1" at the all-ones-out terminal 495 and in the fourth test storage block 485d. In the event that a logic level "0" is present in the fourth test storage block 485d, a stuck-at-zero fault may be diagnosed for the configuration circuits 410a,b and 410c,d. Similarly, an ATPG routine may program configuration storage blocks 460a,b with a logic level "0" and the second test storage block 485b with a logic level "1" and expect to see a logic level "1" at the all-zeros-out terminal 490 and in the third test storage block 485c. In the event that a logic level "0" is present in the third test storage block 485c, a stuck-at-one fault may be diagnosed for the configuration circuits 410a,b and 410c,d. Since the serial test chain is implemented with combinatorial logic, no large storage structures or sequential logic and the incumbent clocking structure are necessary to implement a scan-based routine to provide observability and propagate diagnostic results from across the I/O blocks being tested.

Rather, signals provided on the test-all-zeros terminal 475 and the test-all-ones terminal 470 effect independent test modes for determining stuck-at "1" and stuck-at "0" faults respectively. By applying a logic level "1" to either the test-all-zeros terminal 475 or the test-all-ones terminal 470 and conditioning all configuration commands coming from the control circuit 455 to correspondingly all be a logic level "0" or "1," stuck-at "1" and stuck-at "0" fault indications may be propagated to the all-zeros-out terminal 490 and the all-ones-out terminal 495 respectively. A logic level "0" on either the all-zeros-out terminal 490 or the all-ones-out terminal 495 indicates the corresponding stuck-at fault. For example, a stuck-at "1" fault may be diagnosed by the all-zeros-out terminal 490 being a logic level "0" when the test-all-zeros terminal 475 is at a logic level "1," the test-all-ones terminal 470 is at a logic level "0," and the first and the second configuration lines 450a,b are at a logic level "0."

The table below delineates the various test modes possible and the logic levels to be applied to the test-all-zeros terminal 475 or the test-all-ones terminal 470 to implement each mode. The test 'all configuration command signals are "1"' mode and the test 'all configuration command signals are "0"' mode are independent and mutually exclusive.

TABLE 1

| Test Mode | test-all-zeros terminal | test-all-ones terminal |
| --- | --- | --- |
| normal operation | 0 | 0 |
| all configuration command signals are "1" | 0 | 1 |
| all configuration command signals are "0" | 1 | 0 |
| not defined | 1 | 1 |

In the 'all configuration command signals are "1"' mode, a logic level "1" is provided on the first and the second configuration lines 450a,b to the inputs of the configuration circuits 410a,b and 410c,d. Generally, configuration lines may have their logic level determined according to a test vector generated by an ATPG routine and provided according to a scan-based test capability available within the control circuit 455. A logic level "1" is applied to the test-all-ones terminal 470 and a logic level "0" is maintained on the test-all-zeros terminal 475. When no stuck-at "0" fault is present in any of the configuration circuits 410a,b and 410c,d; all of the endpoints 435a,b and 435c,d will be provided with a logic level "1." This condition indicates a correct propagation of the logic level "1" from the inputs to the outputs of the configuration circuits 410a,b and 410c,d.

Each AND gate in the serial test chain receives a logic level "1" from the corresponding endpoints 435a,b and 435c,d and a second logic level "1" from either the AND gate in the preceding stage of the test chain (e.g., the succession of the diagnostic circuits 440a,b,c,d) or from the logic level "1" applied to the test-all-ones terminal 470 (in the case of the AND gate in the first diagnostic circuit 440a). When any one of the configuration circuits 410a,b and 410c,d has a stuck-at "0" fault present, the corresponding one of the endpoints 435a,b and 435c,d will present a logic level "0." This condition indicates an incorrect propagation of the logic level "1" from the corresponding input(s) to the output(s) of at least one of the configuration circuits 410a,b and 410c,d. This stuck-at "0" fault condition is manifest by the all-ones-out terminal 495 presenting a logic level "0" under the 'all configuration command signals are "1"' mode of testing as discussed above.

In the 'all configuration command signals are "0"' mode, a logic level "0" is provided on the first and the second configuration lines 450a,b to the inputs of the configuration circuits 410a,b and 410c,d. A logic level "1" is applied to the test-all-zeros terminal 475 and a logic level "0" is maintained on the test-all-ones terminal 470. When no stuck-at "1" fault is present in any of the configuration circuits 410a,b and 410c,d; all of the endpoints 435a,b and 435c,d will be provided with a logic level "0." This condition indicates a correct propagation of the logic level "0" from the inputs to the outputs of the configuration circuits 410a,b and 410c,d.

Each OR gate in the serial test chain receives a logic level "0" from the corresponding endpoints 435a,b and 435c,d and a second logic level "0" from either the OR gate in the preceding stage of the test chain (e.g., the succession of the diagnostic circuits 440a,b,c,d) or from the output of the first inverter 480a. The first inverter 480a is supplied with the logic level "1" applied to the test-all-zeros terminal 475. When any one of the configuration circuits 410a,b and 410c,d has a stuck-at "1" fault present, the corresponding one of the endpoints 435a,b and 435c,d will present a logic level "1." This condition indicates an incorrect propagation of the logic level "0" from the corresponding input(s) to the output(s) of at least one of the configuration circuits 410a,b and 410c,d. This stuck-at "1" fault condition is manifest by the all-zeros-out terminal 490 presenting a logic level "0" under the 'all configuration command signals are "0"' mode of testing as discussed above.

When at least one configuration circuit of the configuration circuits 410a,b and 410c,d has a stuck-at fault, the configuration command(s) coupled to the configuration circuit(s) having the fault, may be isolated by setting all configuration commands to the same logic level as the stuck-at fault and invoking the test mode for the complementary 'all configuration command signals are "x"' condition (where x="1" or "0"). For example, for a stuck-at "1" fault in a configuration circuit, the all-zeros-out terminal 490 will be at a logic level "0" indicating that at least one configuration circuit has a stuck-at "1" fault. During this test, all configuration command signals are set to a logic level "0" and the test-all-zeros terminal 475 is held at a logic level "1."

By complementing the test mode from 'all configuration command signals are "0"' to 'all configuration command signals are "1",' complementing the configuration commands (e.g., by setting all configuration commands to "1"), and sequencing through the configuration commands by toggling respective configuration commands from the complementary setting of logic level "1" to logic level "0," the all-ones-out terminal 495 will toggle from "1" to "0" for each configuration command coupled to a set of properly operating configuration circuits in the I/O blocks covered by the associated test chain. When the configuration command being toggled does not cause a corresponding toggle of the all-ones-out terminal 495, at least one of the configuration circuits 410a,b and 410c,d coupled to the test chain has the stuck-at "1" fault.

Figure 5:
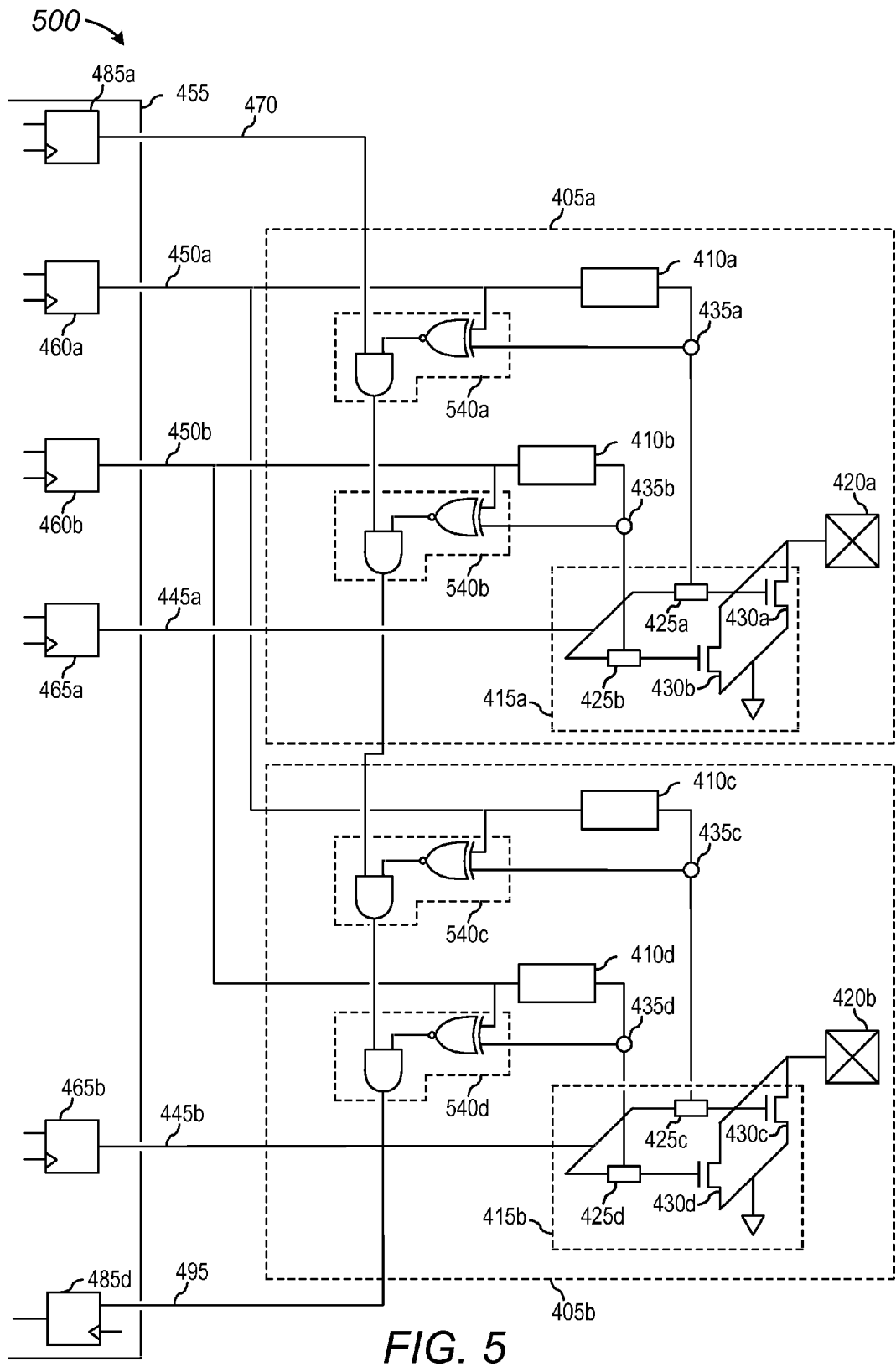
FIG. 5 is a gate-level schematic diagram illustrating a serial test chain configured to diagnose faults across configuration circuits in configurable pull-down blocks, according to an example embodiment.

FIG. 5 is a gate-level schematic diagram illustrating a serial test chain 500 for diagnosing faults across configuration circuits in configurable pull-down blocks, according to an example embodiment. The configuration circuits and drive components in the interface circuits of FIG. 5 are similar to the configuration circuits 410a,b and 410c,d, the drive components 415a and 415b, and the interface circuits 405a,b described above in relation to FIG. 4. These features are similarly labeled in FIG. 5.

However, in the present exemplary embodiment, further diagnostic circuits 540a,b,c,d are configured in a serial chain and may be implemented by AND gates coupled with Exclusive-NOR (XNOR) gates as AND/XNOR pairs in a serial chain. Each XNOR gate is coupled across a corresponding one of the configuration circuits 410a,b and 410c,d. For example, the input and output of a given one of the configuration circuits 410a,b and 410c,d are coupled to inputs of the corresponding XNOR gate. The XNOR gate produces a logic level "1" output as long as the logic levels at the input and the output of the corresponding configuration circuit are the same.

In a manner similar to that discussed above in regard to the diagnostic circuits 440a,b,c,d of FIG. 4, the first diagnostic circuit 540a forms a first stage of the test chain. Successive stages of the test chain are formed from the further diagnostic circuits 540b,c,d and have the second inputs of their respective AND gates coupled to the output of the previous stage of the test chain (i.e., a previous one of the diagnostic circuits 540a,b,c). The cascading of successive stages of the test chain in this way allows a logic level acquired from one of the endpoints 435a,b and 435c,d by a previous stage of the test chain to be propagated through the test chain and combined with a logic level of a further one of the endpoints 435a,b and 435c,d in the present stage. The present stage of the test chain performs a diagnostic function according to the capability of combining a logic level from a previous stage of the test chain with a logic level acquired in the present stage of the test chain. In this way, the present stage of the test chain propagates a logic level that includes a diagnostic analysis of a logic level from a previous stage with the logic level acquired from the present stage. Each of the diagnostic circuits 540a,b,c,d makes up a stage of the test chain and performs a combined function of acquisition and diagnosis across the interface circuits 405a,b. The amalgamation of the diagnostic circuits 540a,b,c,d in a cascaded chain provides the capability to propagate the diagnostic indications to the control circuit 455.

The test-all-ones terminal 470 and the all-ones-out terminal 495 operate as a "test-mode-enable" terminal and "test-out" terminal respectively. The AND/XNOR-based serial chain and the application of a high logic level to the test-all-ones terminal 470 (i.e., "test-mode-enable" terminal) provide observability of a fault in the circuitry covered by the inputs to the XNOR gates in a manner similar to that in the serial chain discussed above (FIG. 4). An indication of a stuck-at fault is propagated to the all-ones-out terminal 495 (i.e., "test-out" terminal) at the output of the final AND gate of the chain. For example, a fault is indicated when the test-all-ones terminal 470 is at a logic level "1" and the all-ones-out terminal 495 is at a logic level "0."

Implementing the serial chain of diagnostic circuits 540a,b,c,d as AND/XNOR pairs means that diagnosis does not depend on the logic level of the corresponding configuration command signal in order to detect a stuck-at fault in the configuration circuit. Accordingly, the AND/XNOR-based serial chain may be used where the configuration commands are not controllable by the control circuit 455 to all be set to a logic level "1" or "0" at the same time. As long as the configuration commands can be set to a logic level "1" and a logic level "0" at some time in a testing sequence, both levels will have been applied to the corresponding configuration circuits 410a,b and 410c,d and reveal the presence of a stuck-at fault within the configuration circuits. With both logic levels having been applied to the configuration circuits, any stuck-at fault present in the configuration circuits will have been rendered observable by a difference between the input level and the output level and produce a corresponding logic level "0" at the output of the associated XNOR gate. The logic level "0" is propagated through the serial test chain to the all-ones-out terminal 495, indicating a test failure and a stuck-at fault in a configuration circuit.

In a manner similar to that described above in regard to the test chain of FIG. 4, the configuration command corresponding with the configuration circuit having the stuck-at fault may be determined by setting the test-all-ones terminal 470 to a logic level "1" and toggling the configuration commands in sequence. Unless the logic level of the configuration command is known and controllable at the time the all-ones-out terminal 495 is at a logic level "0," it may only be knowable that there is a stuck-at fault and not whether the stuck-at fault is a stuck-at "1" or a stuck-at "0." For instance, the level of controllability of the control circuit 455 may only be enough to induce a toggling of configuration commands and not whether the configuration commands are at a particular logic level. The ability to toggle will provide both logic levels to the configuration circuit and provide observability of a stuck-at fault within the configuration circuit.

Figure 6:
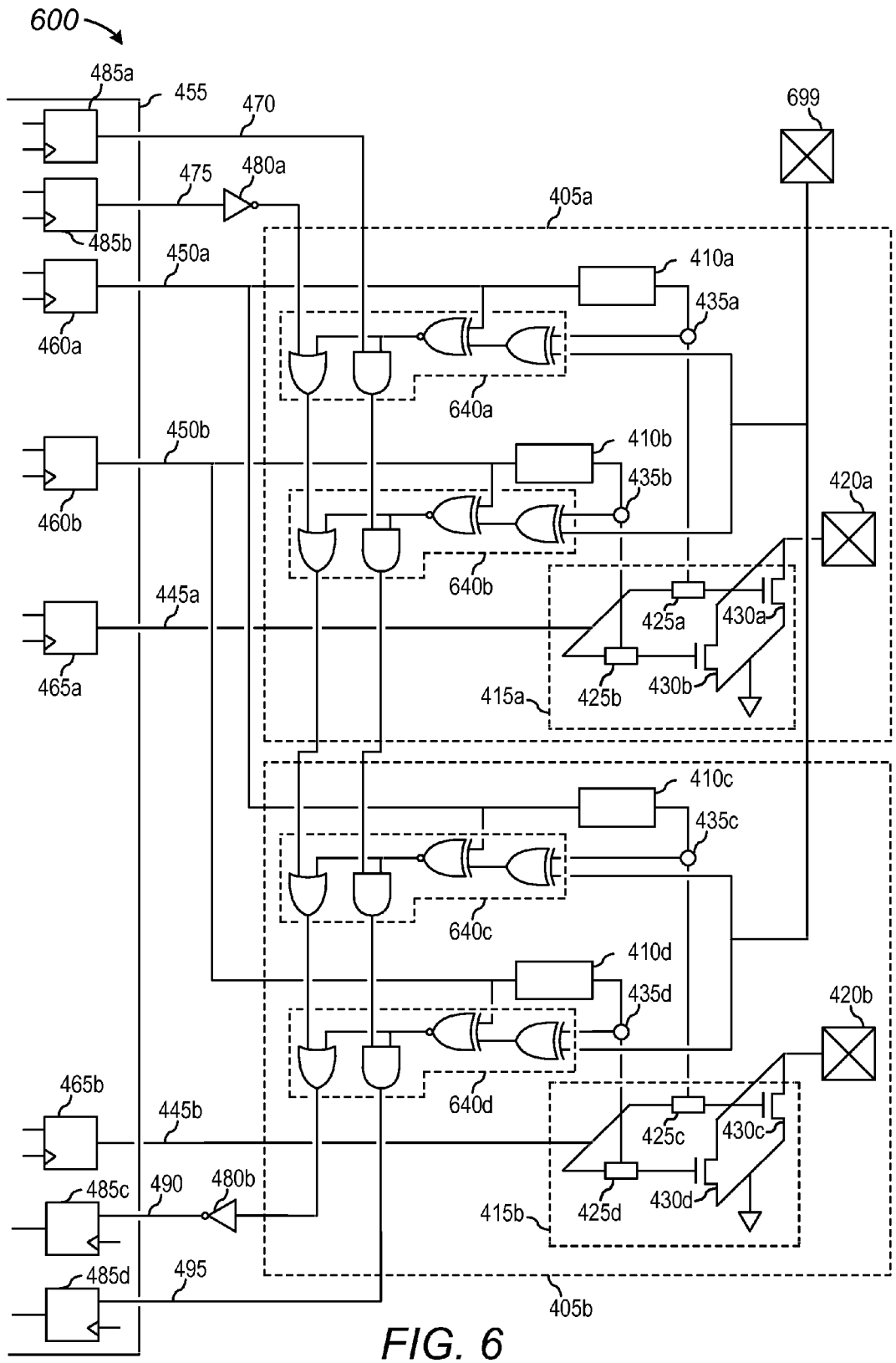
FIG. 6 is a gate-level schematic diagram illustrating a serial chain configured to diagnose stuck-at faults across configuration circuits and within the serial chain, according to an example embodiment.

FIG. 6 is a gate-level schematic diagram illustrating a serial test chain 600 for diagnosing stuck-at faults across configuration circuits and within the serial chain, according to an example embodiment. The configuration circuits and drive components in the interface circuits of FIG. 6 are similar to the configuration circuits 410a,b and 410c,d; the drive components 415a and 415b; and the interface circuits 405a,b described above in relation to FIG. 4. These features are similarly labeled in FIG. 6.

AND gates and OR gates are combined in diagnostic circuits which are cascaded across the first and the second interface circuits 405a,b to form a combinatorial test chain. Respective ones of a set of diagnostic circuits 640a,b,c,d are communicatively coupled to a corresponding endpoint 435a, b,c,d as a combination of an XNOR and an Exclusive-OR (XOR) gate (i.e., an XNOR/XOR gate combination). Implementing the diagnostic circuits 640a,b,c,d as XNOR/XOR gate combinations produces XNOR/XOR pairs.

In a manner similar to that discussed above in regard to the diagnostic circuits 440a,b,c,d of FIG. 4, the first diagnostic circuit 640a forms a first stage of the test chain. Successive stages of the test chain are formed from the further diagnostic circuits 640b,c,d and have the second inputs of their respective AND gates and OR gates coupled to a corresponding output of the previous stage of the test chain (i.e., a previous one of the diagnostic circuits 640a,b,c). The cascading of successive stages of the test chain in this way allows a logic level acquired from one of the endpoints 435a,b and 435c,d by a previous stage of the test chain to be propagated through the test chain and combined with a logic level of a further one of the endpoints 435a,b and 435c,d in the present stage. The present stage of the test chain performs a diagnostic function according to the capability of combining a logic level from a previous stage of the test chain with a logic level acquired in the present stage of the test chain. In this way, the present stage of the test chain propagates a logic level that includes a diagnostic analysis of a logic level from a previous stage with the logic level acquired from the present stage. Each of the diagnostic circuits 640*a,b,c,d* makes up a stage of the test chain and performs a combined function of acquisition and diagnosis across the interface circuits 405*a,b*. The amalgamation of the diagnostic circuits 640*a,b,c,d* in a cascaded chain provides the capability to propagate the diagnostic indications to the control circuit 455.

The test-all-ones terminal 470 and the test-all-zeros terminal 475 are coupled to various elements and operate as described above in relation to FIG. 4. However, while the test-all-ones terminal 470 and the test-all-zeros terminal 475 function as discussed above, they operate conceptually as a "test-controls" terminal and a "test-xnor" terminal, respectively. The all-zeros-out terminal 490 and the all-ones-out terminal 495 are communicatively coupled to the second set of test storage blocks 485*c,d* as described in relation to FIG. 4, however, operationally they function as a "test-xnor-out" terminal and a "test-controls-out" terminal, respectively.

In the cascaded XNOR/XOR pairs, each of the diagnostic circuits 640*a,b,c,d* is coupled with a corresponding XNOR gate of an XNOR/XOR gate combination. The XNOR gate is further coupled to the input of a corresponding configuration circuit and the XOR gate. The XOR gate further couples between the output of the corresponding configuration circuit and a test-xnor terminal 699. The test-xnor terminal 699 is the same functional node as the test-all-zeros terminal 475 operating as the "test-xnor terminal" as discussed above.

Each XNOR/XOR gate combination is coupled across a corresponding one of the configuration circuits 410*a,b* and 410*c,d*. Accordingly, the input and output of a given configuration circuit are coupled to inputs of the corresponding XNOR/XOR gate combination. The XNOR gate produces a logic level "1" output as long as the logic levels at its inputs are the same. These two inputs to the XNOR gate are the input to the configuration circuit and the output of the XOR gate. The XOR will propagate the logic level output from the configuration circuit as long as a logic level "0" is present on the test-xnor terminal 699. The logic level "0" applied to the test-xnor terminal 699 places the XOR gates in a "non-inverting" mode of operation. When no stuck-at fault is present in the configuration circuit, the input and output logic levels of the configuration circuit match. This is the case when the first input of the XNOR gate (coupled to the input of the configuration circuit) and the logic level output from the configuration circuit, as propagated through non-inverting operation of the XOR gate, match. A stuck-at fault in the configuration circuit causes a mismatch between the input and output logic levels of the configuration circuit. Accordingly, the XNOR gate outputs a logic level "0" and a stuck-at fault condition is indicated.

Additionally, when a logic level "1" is present on the test-xnor terminal 699, an inverting operation is produced across the XOR gate. For an otherwise fault-free configuration circuit, the inverting operation of the XOR gate produces a mismatch across the inputs to the XNOR gate, causing the XNOR gate to output a logic level "0" when no stuck-at fault is present in the configuration circuit. This test operation is possible regardless of the logic level applied to the configuration circuit due to the inverting operation of the XOR gate with a logic level "1" present on the test-xnor terminal 699.

In the event the XNOR gate output does not go to a logic level "0," a stuck-at "1" condition exists in the XNOR gate. Accordingly, addition of the XOR gate and the ability to provide logic levels to the XOR gate for normal operation and a test mode, allow detection of a stuck-at "1" fault at the output of the XNOR gate. These logic levels are provided to the XOR gate according to the test-xnor terminal 699. This diagnosis capability provides resilience against false-positive testing results, which would otherwise mask fault conditions within the corresponding configuration circuit.

The below table delineates the various test modes possible and the logic levels to be applied to the "test-controls" terminal (i.e., test-all-ones terminal 470) and the "test-xnor" terminal (i.e., test-all-zeros terminal 475) to effect each mode. The 'test XNOR gates' mode is absolute when invoked by a logic level "1" on the test-xnor terminal (test-all-zeros terminal 475) and will override the 'test configuration commands' mode. In 'normal operation' mode, the "test-xnor-out" terminal and the "test-controls-out" terminal are tested and verified to produce a logic level "0," thus indicating the cascading chain of AND/OR gates is functioning properly.

TABLE 2

| Test Mode | test-controls terminal | test-xnor terminal |
| --- | --- | --- |
| normal operation | 0 | 0 |
| test XNOR gates | 0 | 1 |
| test configuration commands | 1 | 0 |
| test XNOR gates | 1 | 1 |

Figure 7:
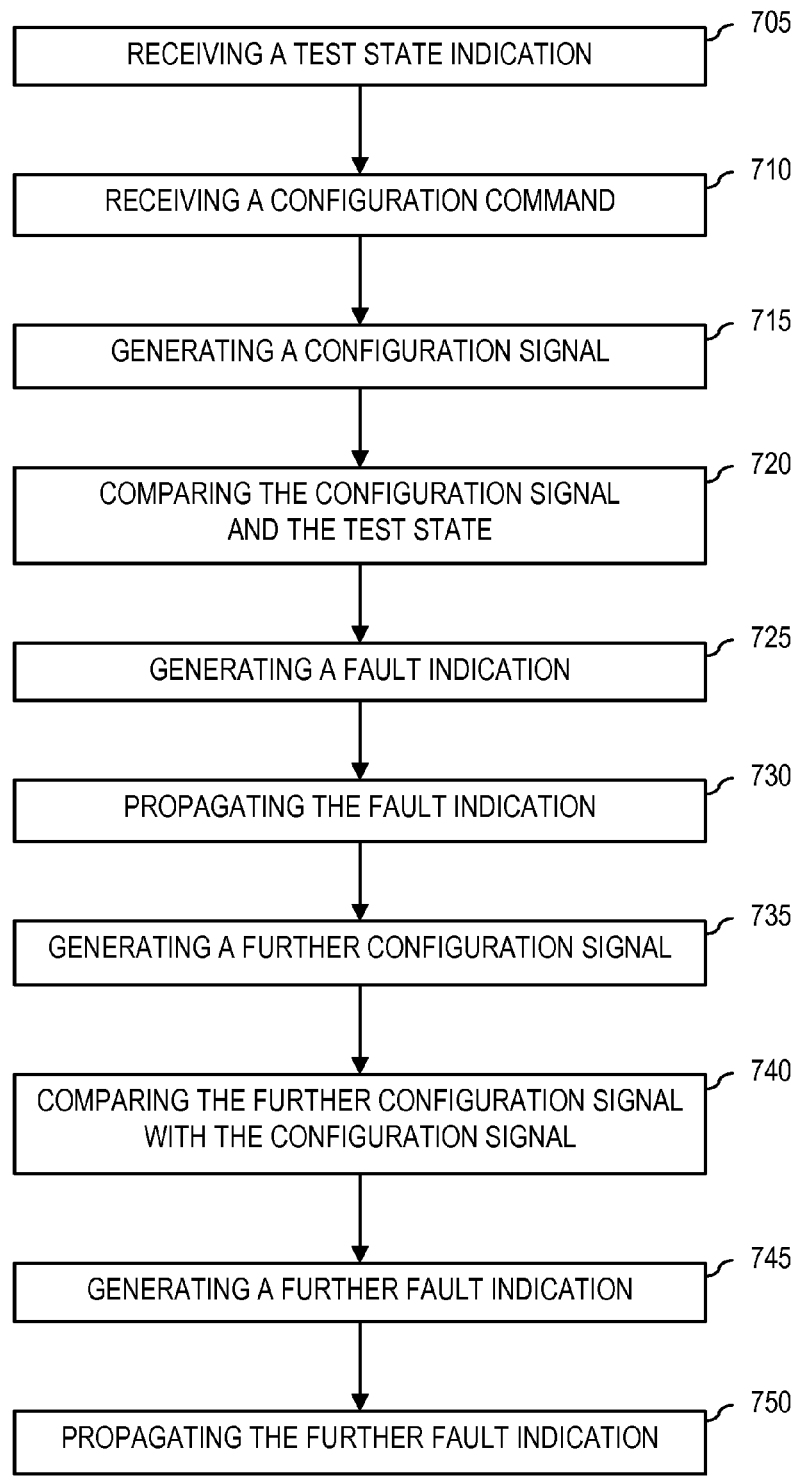
FIG. 7 is a flow diagram of a method of diagnosing a fault in an interface circuit, according to an example embodiment.

FIG. 7 is a flow diagram of a method of diagnosing a fault in an interface circuit 700 in accordance with an example embodiment. The process of FIG. 7 may be performed by various types of systems. To provide a specific example, the process will be described with reference to the system of FIG. 4.

In step 705, a test state indication is received at test input terminals, such as the test-all-ones terminal 470 and the test-all-zeros terminal 475 (FIG. 4). For example, a logic level "1" is applied to the test-all-ones terminal 470 and a logic level "0" is maintained on the test-all-zeros terminal 475 to invoke the 'all configuration command signals are "1"' test mode (Table 1). The control circuit 455 may generate the test state indication. In step 710, a set of the configuration commands is received at configuration circuit 410*a* within the first interface circuit 405*a*. For example, a first configuration command signal may be applied to the configuration circuit 410*a* as a logic level "1." In step 715, the configuration circuit 410*a* generates an initial configuration signal according to the first configuration command signal. The configuration circuit 410*a* generates the initial configuration signal as a first portion of the set of configuration signals. The first configuration command signal may have the logic level "1" and be applied to the configuration circuit 410*a*. The configuration circuit 410*a* may erroneously produce the initial configuration signal with a logic level "0" at an output. The configuration circuit 410*a* produces a logic level "1" based on a configuration command signal having the logic level "1" in a normal functioning state.

In step 720, the first diagnostic circuit 440*a* compares the initial configuration signal generated by the configuration circuit 410*a*, at a logic level "0," and the test state indication, at a logic level "1." In step 725, the first diagnostic circuit 440*a* generates an indication of a fault existing within the configuration circuit 410*a* when a difference is determined between the initial configuration signal and the test state indication. The determination may be made, for example, by the AND gates and OR gates in the diagnostic portion (discussed above) of the first diagnostic circuit 440*a*. In step 730, the first diagnostic circuit 440*a* propagates the fault indication to the control circuit 455.

In step 735, the configuration circuit 410*a* generates a further configuration signal according to a further configuration command (e.g., a further portion of a set of configuration commands) being applied to the configuration circuit 410*a*. The further configuration command differs from the first portion of the set of configuration commands. For example, in the first portion of the set of configuration commands, a logic level "1" is provided, on the first configuration line 450*a*, to the input of the first configuration circuit 410*a*. In the further configuration command a logic level "0" is generated on the first configuration line 450*a*.

In step 740, the first diagnostic circuit 440*a* compares the further configuration signal and the configuration signal generated by the configuration circuit 410*a* in step 715. In step 745, the first diagnostic circuit 440*a* generates an indication of a further fault existing within the configuration circuit 410*a* when the further configuration signal and the configuration signal generated by the configuration circuit 410*a* in step 715 are determined to be the same. The first portion of the set of configuration commands (a logic level "1") and the further configuration command (a logic level "0") differ and should therefore produce differing configuration signals from the configuration circuit 410*a*. When differing configuration commands produce the same configuration signals, the configuration circuit 410*a* being diagnosed is diagnosed to be faulty. In step 750, the first diagnostic circuit 440*a* propagates a further fault indication to the control circuit 455. The process of FIG. 7 may be modified, for example, by adding, omitting, reordering, or altering steps. Additionally, steps may be performed concurrently.

In each of the preceding test modes, a single test mode configuration command and a single test output signal produce a stuck-at fault indication for a plurality of I/O blocks being diagnosed. Each test mode vector includes the corresponding conditioning of the configuration commands originating from the control circuit 455. Therefore, these test modes may be implemented with a minimum of test mode control and test output signals and with a minimum of conditioning of the configuration commands being output from the control circuit 455. These aspects in conjunction with the use of a minimum set of combinatorial logic mean that an economical way in terms of time, die area, and circuits may be required to implement the cascading test chain for stuck-at fault verification. No sequential logic, storage elements, or scan clocking schemes are used or required in implementing the preceding aspects.

Aspects of the present exemplary embodiments use only combinatorial logic to implement test chains. Having the cascaded combinatorial logic for diagnosing stuck-at faults in I/O block configuration logic, may mean that a less expensive tester may be used to exercise the cascaded combinatorial logic and gain reasonably high fault coverage as opposed to having to use a much more expensive tester to gain and incrementally higher achievement in fault coverage. For example, a digital tester may be able to apply the test vectors to- and acquire the stuck-at fault indications from the combinatorial logic chain connected to test points within a configurable output buffer. This contrasts with having to use a more expensive analog tester to apply configuration commands to output drive buffers to configure output configuration circuitry and measure the actual configured analog output voltages and currents on the chip output pad. The latter approach typically requires longer testing time and more extensive test vectors then does the all-digital testing according to the cascaded combinatorial logic chain.

Those of skill in the art will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

Although embodiments of the invention are described above for particular embodiments, many variations of the invention are possible, including, for example, those with different logic elements in configuration circuits. Additionally the embodiments have been described for CMOS technology but similar circuits may be used with other technologies. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A device comprising:
   a control circuit configured to generate data signals and configuration commands;
   an interface circuit communicatively coupled to the control circuit to receive the data signals and the configuration commands, the interface circuit is selectively configured to generate a set of configuration signals according to the configuration commands and generate interface signals according to the data signals; and
   a diagnostic circuit communicatively coupled to the control circuit and the interface circuit and selectively configured to receive a test state indication and acquire a corresponding portion of the set of configuration signals.

2. The device of claim 1, wherein the interface circuit further comprises:
   at least one configuration circuit communicatively coupled to the control circuit and the diagnostic circuit and selectively configured to generate the set of configuration signals according to the configuration commands; and
   a drive component communicatively coupled to the control circuit and including at least one drive device communicatively coupled through a corresponding configuration device to an associated one of the at least one configuration circuits, each configuration device is configured to receive at least a portion of the set of configuration signals, the drive component is selectively configured to generate the interface signals according to the data signals and with a drive characteristic determined by the configuration signals applied to the configuration devices corresponding to the at least one drive device, and further wherein the drive component is configured to transmit the interface signals from a semiconductor die through a pad to a further semiconductor die.

3. The device of claim 2, wherein the diagnostic circuit is configured, according to the test state indication, to:

acquire a first portion of the set of configuration signals and propagate the test state indication when the first portion of the set of configuration signals corresponds to the test state indication;

diagnose the at least one configuration circuit according to a comparison of the first portion of the set of configuration signals and the test state indication;

diagnose the at least one configuration circuit as functional when the first portion of the set of configuration signals corresponds with the test state indication;

diagnose the at least one configuration circuit as faulty when the first portion of the set of configuration signals does not correspond with the test state indication;

propagate the test state indication when the at least one configuration circuit is diagnosed as functional; and propagate a logic state, which is the complement of the test state indication, when the at least one configuration circuit is diagnosed as faulty.

4. The device of claim 2, wherein the control circuit is configured to generate a further configuration command and transmit the further configuration command to the at least one configuration circuit;

the at least one configuration circuit is configured to generate, according to the further configuration command, a further portion of the set of configuration signals as a complement of the first portion of the set of configuration signals;

the diagnostic circuit is further configured to diagnose the at least one configuration circuit according to a comparison of the further portion of the set of configuration signals and the test state indication; and the diagnostic circuit is configured to diagnose that a fault exists within the at least one configuration circuit when the further portion of the set of configuration signals is the same as the first portion of the set of configuration signals.

5. The device of claim 1, wherein the interface circuit is configured to:

interface from a first semiconductor device to a second semiconductor device by transmitting and receiving the interface signals and propagate the interface signals through pads arranged on the surfaces of the first semiconductor device and the second semiconductor device.

6. The device of claim 2, wherein the interface circuit is configured to:

generate the interface signals by pulling an electric potential of a pad to a corresponding source voltage; and pull the electric potential of the pad to a corresponding source voltage according to the drive characteristic, and further wherein the drive characteristic is an impedance.

7. The device of claim 6, wherein the at least one drive device and the corresponding configuration device are arranged in combination within a leg and the drive component is selectively configured according to the set of configuration signals to activate respective legs of the at least one drive device and corresponding configuration device and further wherein the legs are arranged in parallel between the pad and a source voltage.

8. The device of claim 7, wherein each of the at least one configuration circuits is configured to generate a respective one of the set of configuration signals to activate a corresponding one of the respective legs and further wherein each one of the respective legs is independently activated.

9. The device of claim 7, wherein the at least one configuration circuit is configured to generate each one of the set of configuration signals to activate one of the respective legs, and further wherein:

each of the respective activated legs is configured by the associated one of the set of configuration signals to pull at least a portion of the electric potential of the pad to the corresponding source voltage with a drive characteristic determined by a conductive channel of the associated at least one drive device;

each of the at least one drive devices is a transconductance device having the conductive channel equal to a conductive channel width of the respective transconductance device; and each of the conductive channel widths of the respective transconductance devices is independent of one another.

10. A method of diagnosing a fault in an interface circuit comprising:

at a test input terminal, receiving a test state indication from a control circuit;

receiving a configuration command at a configuration circuit within the interface circuit;

generating at least one configuration signal from the configuration circuit according to the configuration command;

comparing the at least one configuration signal to the test state indication using at least one stage of a diagnostic circuit;

generating a fault indication, corresponding to the configuration circuit, when a difference is determined between the at least one configuration signal and the test state indication; and propagating the fault indication to the control circuit through the at least one stage of the diagnostic circuit.

11. The method of claim 10, further comprising:

generating a further configuration signal from the configuration circuit according to a further configuration command, the further configuration command differing from the first configuration command;

comparing the further configuration signal to the at least one configuration signal using the at least one stage of the diagnostic circuit;

generating an indication of a further fault existing within the configuration circuit when the further configuration signal and the at least one configuration signal are determined to be the same; and propagating the further fault indication to the control circuit through the at least one stage of the diagnostic circuit.

12. An apparatus to diagnose a fault in an interface circuit, the apparatus comprising:

a control means configured to be communicatively coupled to a testing means to receive data signals and test commands, the control means is further configured, according to the test commands, to generate configuration commands corresponding to the data signals;

at least one interface circuit communicatively coupled to the control means and configured to receive the data signals and the configuration commands, the at least one interface circuit is selectively configured to generate a set of configuration signals according to the configuration commands and generate interface signals according to the data signals; and a diagnostic means including at least one stage of a diagnostic circuit, each of the at least one stages of diagnostic circuits is communicatively coupled to the control means and a corresponding one of the at least one interface circuits and, the diagnostic means is selectively configured according to the test commands to receive a test state indication and acquire a corresponding portion of the set of configuration signals.

13. The apparatus of claim 12, wherein the at least one interface circuit further comprises:

at least one configuration means communicatively coupled to the control means and the at least one stage of the diagnostic means and selectively configured to generate the set of configuration signals according to the configuration commands; and a drive means communicatively coupled to the control means and including at least one drive device communicatively coupled through a corresponding configuration device to an associated one of the at least one configuration means, each configuration device is configured to receive at least a portion of the set of configuration signals, the drive means is selectively configured to generate at least a portion of the interface signals according to the data signals and with a drive characteristic determined according to the portion of the set of configuration signals applied to the configuration devices corresponding to the at least one drive device.

14. The apparatus of claim 13, wherein the diagnostic means is configured, according to the test state indication, to:

acquire a first portion of the set of configuration signals and propagate the test state indication when the first portion of the set of configuration signals corresponds to the test state indication;

diagnose the at least one configuration means according to a comparison of the first portion of the set of configuration signals and the test state indication;

diagnose the at least one configuration means as functional when the first portion of the set of configuration signals corresponds with the test state indication;

diagnose the at least one configuration means as faulty when the first portion of the set of configuration signals does not correspond with the test state indication;

propagate the test state indication when the at least one configuration means is diagnosed as functional; and propagate a logic state, which is the complement of the test state indication, when the at least one configuration means is diagnosed as faulty.

15. The apparatus of claim 13, wherein:

the control means is configured to generate a further configuration command and transmit the further configuration command to the at least one configuration means;

the at least one configuration means is configured to generate a further portion of the set of configuration signals; and the diagnostic means is configured to further diagnose the at least one configuration means according by comparing the further portion of the set of configuration signals and the test state indication, and the diagnostic means is configured to diagnose that a fault exists within the at least one configuration means when the further portion of the set of configuration signals is the same as the test state indication.

16. The apparatus of claim 13, wherein:

the control means is configured to generate a further configuration command and transmits the further configuration command to the at least one configuration means;

the at least one configuration means is configured to generate a further portion of the set of configuration signals; and the diagnostic means is configured to diagnose the at least one configuration means according to a comparison of the further portion of the set of configuration signals and the first portion of the set of configuration signals, and the diagnostic means is configured to diagnose that a fault exists within the at least one configuration means when the further portion of the set of configuration signals is the same as the first portion of the set of configuration signals.

17. The apparatus of claim 13, wherein the at least one interface circuit is configured to:

generate the interface signals by pulling an electric potential of a pad to a corresponding source voltage; and pull the electric potential of the pad to a corresponding source voltage according to the drive characteristic, and further wherein the drive characteristic is an impedance.

18. The apparatus of claim 17, wherein the at least one drive device and the corresponding configuration device are arranged in combination within a leg and the drive means is selectively configured according to the set of configuration signals to activate respective legs of the at least one drive device and the corresponding configuration device and further wherein the legs are arranged in parallel between the pad and a source voltage.

19. The apparatus of claim 18, wherein each of the at least one configuration means is configured to generate a respective one of the set of configuration signals to activate a corresponding one of the respective legs and further wherein each one of the respective legs is independently activated.

20. The apparatus of claim 18, wherein the at least one configuration means is configured to generate each one of the set of configuration signals to activate one of the respective legs, and further wherein:

each of the respective activated legs is configured by the associated one of the set of configuration signals to pull at least a portion of the electric potential of the pad to the corresponding source voltage with a drive characteristic determined by a conductive channel of the associated at least one drive device;

each of the at least one drive devices is a transconductance device having the conductive channel equal to a conductive channel width of the respective transconductance device; and each of the conductive channel widths of the respective transconductance devices is independent of one another.

* * * * *